(12) United States Patent
Pandey et al.

(10) Patent No.: US 7,644,380 B1
(45) Date of Patent: Jan. 5, 2010

(54) METHOD FOR ANALYZING CIRCUITS HAVING MOS DEVICES

(75) Inventors: Manish Pandey, Saratoga, CA (US); Samuel L. Kerner, Dorchester, MA (US); Chih-chang Lin, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 226 days.

(21) Appl. No.: 11/433,960

(22) Filed: May 15, 2006

Related U.S. Application Data

(60) Provisional application No. 60/784,225, filed on Mar. 20, 2006.

(51) Int. Cl.
*G06F 17/50* (2006.01)
(52) U.S. Cl. .......................................... 716/4
(58) Field of Classification Search ................ 716/1–18
See application file for complete search history.

(56) References Cited

OTHER PUBLICATIONS

Baba-ali et al., An Efficient Algorithm for Signal Flow Determination In Digital CMOS VLSI, Proceedings of the 1996 European Design and Test Conference, Mar. 1996, pp. 288-293.*

Blaauw et al., Derivation of Signal Flow for Switch-Level Simulation, Proceedings of the European Design Automation Conference, Mar. 1990, pp. 301-305.*
A. R. Baba-Ali, et al., "An Efficient Algorithm for Signal Flow Determination in Digital CMOS VLSI," European Conference on Design and Test, IEEE Computer Society, 1996.
Kuen-Jong Lee, et al., "A New Method for Assigning Signal Flow Directions to MOS Transistors," 492-495, in ICCAD-90, Nov. 11-15, 1990, Santa Clara, CA, USA, Digest of Technical Papers. IEEE Computer Society, 1990, ISBN 0-8186-2055-2.

* cited by examiner

*Primary Examiner*—Jack Chiang
*Assistant Examiner*—Aric Lin
(74) *Attorney, Agent, or Firm*—Vista IP Law Group, LLP

(57) ABSTRACT

Method for analyzing a circuit composed of MOS devices. The method can be used to direct MOS devices in static and dynamic circuits and involves identifying an undirected MOS device that connects nets. Functions of the nets that cause each net to be logic values are defined as a function of inputs to the circuit. The defined functions can include pulldown functions or both pullup and pulldown functions. A set of rules is used to determine the direction of a signal that flows through a device and applies defined functions. The rules for analyzing static devices may differ from the rules for analyzing dynamic devices. Devices that are determined to have uni-directional signal flow can be directed. Additionally, devices having bi-directional signal flow and uni-directional observability can be directed.

38 Claims, 17 Drawing Sheets

Figure 11: General Static Case

Figure 14: Pre-charged Case

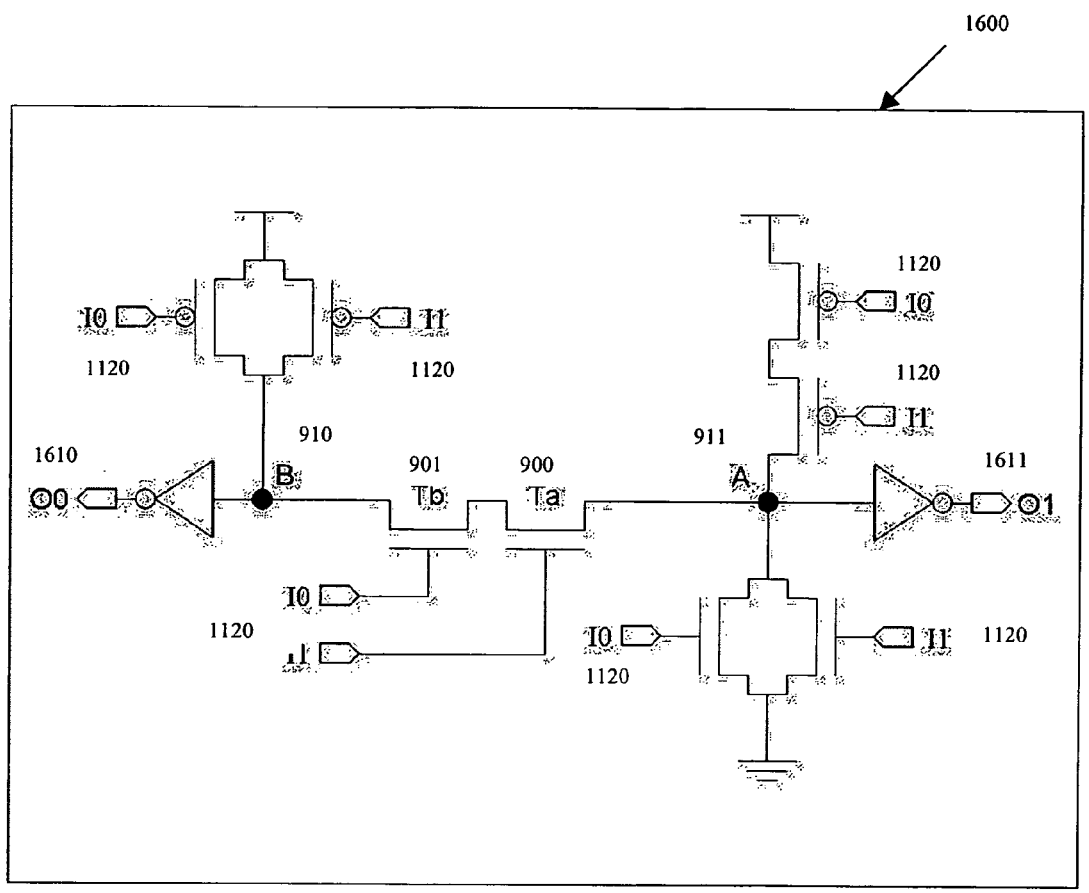
Figure 16: Static CMOS AND/OR Gate Before Series-Parallel Reduction

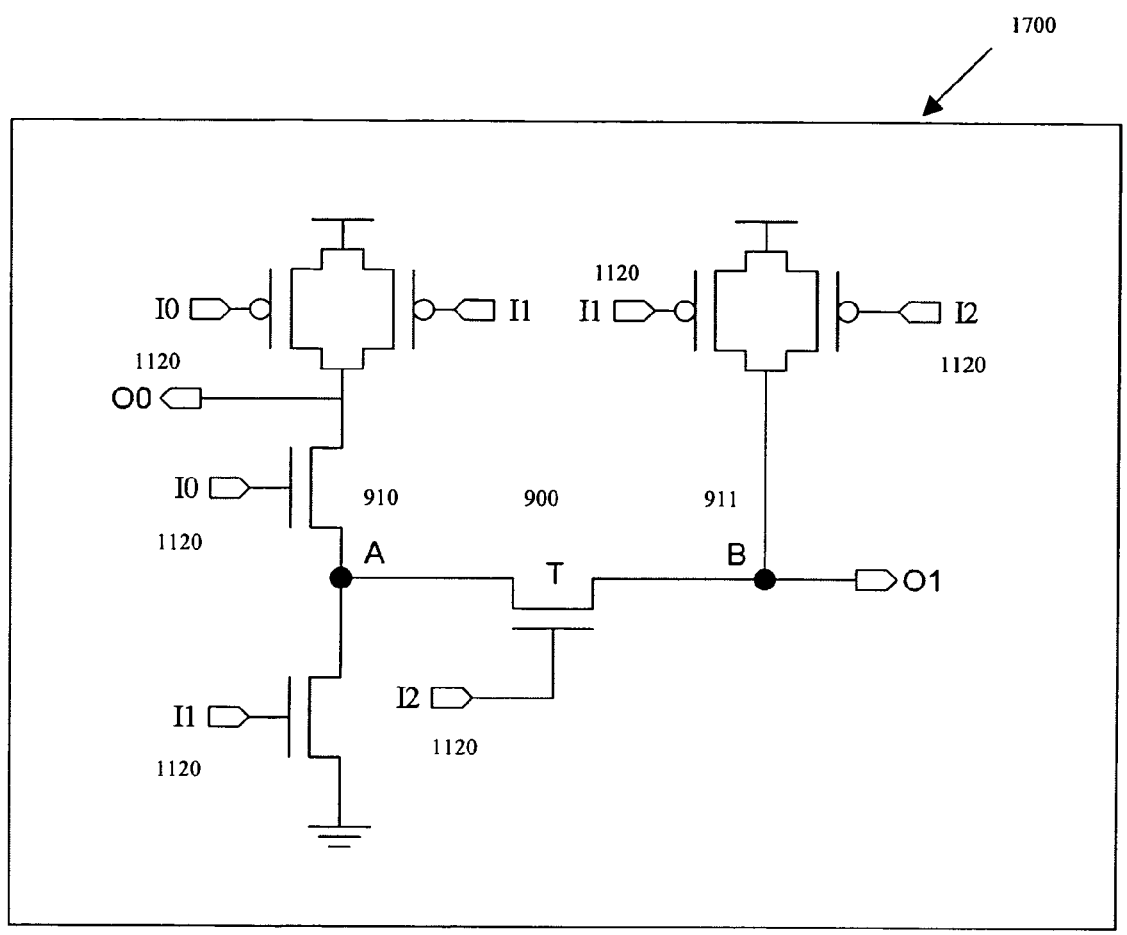
Figure 17: Static CMOS Double-NAND Gate

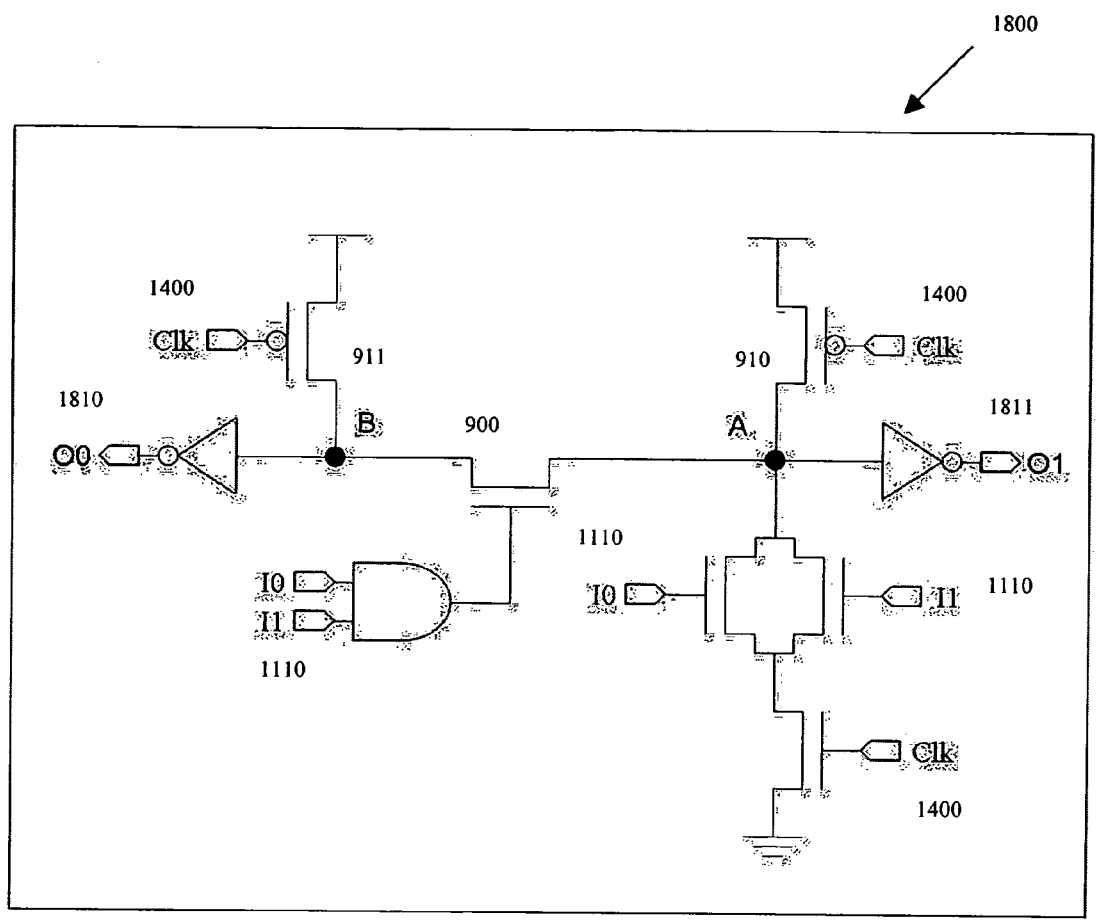
Figure 18: Pre-charge AND/OR Gate

METHOD FOR ANALYZING CIRCUITS HAVING MOS DEVICES

CROSS REFERENCE TO RELATED APPLICATION

The present application claims priority under 35 U.S.C. 119 of U.S. Provisional Application No. 60/784,225, filed on Mar. 20, 2006, the contents of which are incorporated herein by reference as though set forth in full.

FIELD OF THE INVENTION

The present invention relates generally implementing MOS devices and, more particularly, to analyzing circuits having MOS devices and directing MOS devices.

BACKGROUND

Custom logic circuits are typically expressed as a netlist of undirected MOS devices. In such circuits, a signal often flows through a given MOS device in only one direction. For such devices, it is not necessary to analyze the possibility that signals flow in the opposite direction, thus simplifying analysis of the circuit. Determining which MOS devices have uni-directional signals can be very useful in several Electronic Design Application (EDA) applications, such as switch-level timing, fault grading, and logical abstraction of the circuit's function for equivalence checking, Automatic Test Pattern Generation (ATPG) and simulation acceleration. With logical abstraction, for example, EDA tools can represent a circuit as a graph. The nodes of this graph represent nets, and the edges represent MOS devices. The number of paths through the graph that must be examined can be greatly reduced if the direction of a signal through a MOS device is known. Several known methods are used to direct MOS devices. While these methods have been effective to some degree, they can be improved.

One known method requires a user to manually assign directions to MOS devices. Manually assigning directions, however, places unnecessary burdens on the user, and is not time and cost efficient. Further, manually assigning directions is more likely to result in direction errors, which can cause simulation tools to generate incorrect results.

Another known method is using local topological checks, which direct MOS devices according to a set of rules. For example, a rule may state "A MOS that links to grounded net A to another net B will be directed from A to B." Systems that use rule sets, however, typically have a relatively large number of rules, e.g., about 12 rules. Further, local topology checks cannot direct many types of devices that are found in real circuits. Another shortcoming of local topographical checks is that EDA tools often use rules that are heuristic, i.e. not always correct or accurate, thus causing occasional direction errors and misdirected devices, which must be manually corrected by a user. Additionally, these methods are limited since they analyze local structures and cannot infer the direction of MOS devices based on a global circuit structure.

An additional known method of directing MOS devices is using global checks, which build a connectivity graph. The graph has a node for each net in the circuit, and each MOS device is represented as an edge between the nodes that the MOS device links. Nodes that can be driven from outside the circuit are marked as input nodes, including power and ground nets. Nodes that can drive a device outside the circuit are marked as output nodes. MOS devices are directed based on the existence of paths though the graph. A MOS device linking nets A and B and represented by edge E may drive a signal from A to B if a path in the graph starts on an input node, travels through E from A to B, and ends on an output node. Edge E can be directed if such a path exists in only one direction through E.

Global path check methods, however, can be incomplete. For example, they can leave directable devices undirected, thus resulting in wasted effort by an EDA program. Global check techniques also do not check that the paths they identify are sensitizable, i.e., there exists some input to the circuit that causes the path to conduct a signal. Therefore, these methods can fail to assign direction when a path exists through a MOS device in both directions, but all paths in one direction are not sensitized. Global check methods can also be improved to address this assignment shortcoming by checking for false paths and eliminating the identified false paths from consideration, however, such methods may not be accurate when the circuit is a dynamic circuit that includes pre-charged nets.

Other known methods combine local topology checks with global path checks. Such methods, however, fail to provide a complete system, and may nevertheless require a user to manually assign directions.

Accordingly, there exists a need for a method for directing MOS devices so that circuit analysis is simplified, more time and cost efficient, and more accurate. There also exists a need for a method that eliminates false positives in direction assignment and ensures that direction assignments are safe for all input conditions. Further, the method should detect false paths and be applicable to a wider range of circuits without requiring a user to manually assign devices or correct direction assignments. Methods should also be applicable to both static and dynamic circuits.

Embodiments of the invention fulfill these unmet needs.

SUMMARY

According to one embodiment, a method for directing a MOS device includes identifying an undirected MOS device in a circuit that links first and second nets, defining functions of the first and second nets that cause each net to be a set of logic values as a function of inputs to the circuit, determining whether a signal flows through the undirected MOS device in one or two directions according to a set of rules that applies defined functions and directing the undirected MOS device in one direction if the signal flows through the undirected MOS device in one direction.

According to another embodiment, a method for directing a MOS device includes identifying an undirected MOS device in a circuit that links first and second nets, defining functions of the first and second nets that cause each net to be a set of logic values as a function of inputs to the circuit, and determining whether a signal flows through the undirected MOS device in one or two directions according to a set of rules that applies defined functions. The method further includes directing the undirected MOS device if the signal flows through the undirected MOS device in one direction or the signal flows through the undirected MOS device in two directions and is observable in one direction.

In a further alternative embodiment, a method for directing a MOS device includes identifying an undirected MOS device in a static circuit, the undirected MOS device linking a first net and a second net and defining functions of the first and second nets that cause each net to be a set of $\{1, 0, X, Z\}$ logic values as a function of inputs to the circuit. Defining functions includes defining a pullup function and a pulldown function of each net. A pullup function at a given net maps all possible inputs to a circuit to true if that input causes a conducting path from VDD to that net, and to false otherwise. A pulldown function at a given net maps all possible inputs to a circuit to true if that input causes a conducting path from ground to that net, and to false otherwise.

The method also includes defining functions based on the pullup and pulldown functions, including Zn=~Pun·~PDn, 0n=~Pun·PDn, 1n=Pun·~PDn, and Xn=Pun·PDn. Another function is defined and is true if a signal flows through the MOS device. A determination whether a signal flows through the undirected MOS device in one or two directions is based on a set of rules that applies defined functions. The following rules indicate that a signal flows through the MOS device in one direction: $F \cdot X_A$=false AND $F \cdot X_B$=false, $F \cdot 0_A \cdot 1_B$=false AND $F \cdot 1_A \cdot 0_B$=false, $(F \cdot 1_B \ne F \cdot 1_A)$ OR $(F \cdot 0_B \ne F \cdot 0_A)$, $F \cdot 0_B \rightarrow F \cdot 0_A$, and $F \cdot 1_B \rightarrow F \cdot 1_A$. An undirected MOS device is directed in one direction if the set rules is satisfied so that the signal flows through the undirected MOS device in one direction, or if the signal flows through the undirected MOS device in two directions and is observable in one direction.

According to another alternative embodiment, a method for directing a MOS device includes identifying an undirected MOS device in a dynamic circuit that links first and second nets. At least one net is pre-charged with a clock. The method also includes defining functions of the nets that cause each net to be a set of $\{1, 0, X, Z\}$ logic values as a function of the inputs to the circuit. Defining functions includes defining pulldown and pullup functions of each net. The following functions are defined based on a pulldown function: Zn=false, 0n=PDn, 1n=~PDn, and Xn=false. A function is also defined so that it is true if a signal flows through the undirected MOS device. The method also includes determining whether a signal flows through the undirected MOS device in one or two directions according to a set of rules that applies defined functions. The following rules indicate that a signal flows through the MOS device in one direction: $F \cdot 1_A \cdot 0b$=false, T strongly passes 0, and $(F \cdot 0_B) \ne (F \cdot 0_A)$. An undirected MOS device is directed in one direction if the set of rules is satisfied so that the signal flows through the undirected MOS device in one direction, or if the signal flows through the undirected MOS device in two direction and is observable in one direction.

In one or more or all of the embodiments involving dynamic circuits, one or multiple nets can be pre-charged. Rules that are used for a MOS device in a static circuit having no pre-charged nets are different than rules that are used for MOS devices in a dynamic circuit, having one or more pre-charged nets.

In addition, if it is determined that a signal flows through an undirected MOS device in two directions, alternative embodiments determine whether the two direction signal is observable in only one direction. If so, then the undirected MOS device can be directed in one direction. If not, then the undirected MOS device remains undirected.

BRIEF DESCRIPTION OF THE DRAWINGS

Referring now to the drawings, in which like reference numbers represent corresponding parts throughout, and in which:

FIG. 16 is a circuit diagram of a CMOS AND/OR gate before series-parallel reduction;

FIG. 17 is a circuit diagram of a static CMOS double-NAND gate; and

FIG. 18 is a circuit diagram of a pre-charged AND-OR gate.

DETAILED DESCRIPTION OF ILLUSTRATED EMBODIMENTS

Embodiments of the invention provide methods for analyzing the implementation of Metal Oxide Semiconductor (MOS) devices. Embodiments can be used to assist with extracting several styles of logic, including Complementary MOS (CMOS), pass transistor logic and multiple-output domino logic, and can be applied to any MOS network. More particularly, embodiments provide a method for directing MOS devices or determining a direction in which a signal flows in a MOS device so that circuit simulation and analysis is simplified and more accurate by not analyzing signals in both directions through a MOS device when signal only flows in one direction.

According to one embodiment, the logical function at each of the two nets or endpoints of the MOS device is identified. A set of rules is used to determine the direction of a signal through the MOS device. The rules apply defined functions that test to see if each undirected MOS device can be set to a particular direction without altering the function of the circuit. Further, a direction of a MOS device can be set if a signal can flow in both directions, but the signal can only be observed in one direction. Embodiments can be applied to various MOS devices. Further, embodiments can be applied to static circuits and dynamic circuits having precharged nets.

Figure 1A:
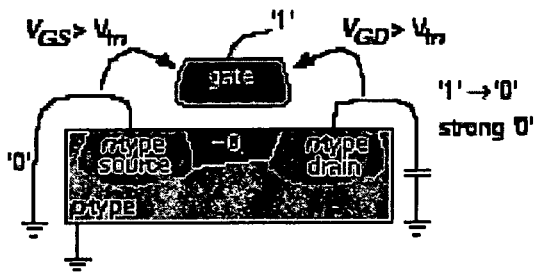
FIG. 1A illustrates a known n-channel MOS transistor.
Figures 1B, 1C:
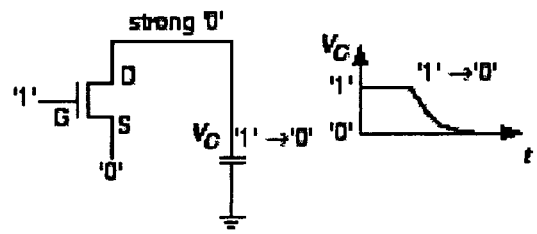
FIG. 1B is a circuit diagram of a known n-channel MOS transistor.
FIG. 1C is a graph showing how a known n-channel MOS transistor functions in response to a gate input.
Figure 2A:
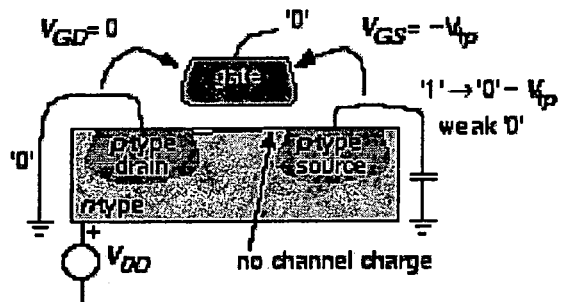
FIG. 2A illustrates a known p-channel MOS transistor.
Figures 2B, 2C:
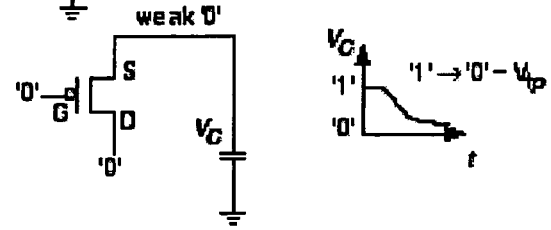
FIG. 2B is a circuit diagram of a known p-channel MOS transistor.
FIG. 2C is a graph showing how a known p-channel MOS transistor functions in response to a gate input.

FIGS. 1A-C and 2A-C provide general reference to provide background information regarding MOS devices. MOS devices, such as MOS Field Effect Transistors (MOSFETs), are often used as switches in Integrated Circuits (ICs), and include a gate (G), a source (S) and a drain (D). There are two basic types of MOS devices: n-channel MOS devices (NMOS) and p-channel MOS devices (PMOS). FIGS. 1A-C illustrate an exemplary NMOS device and its operation, and FIGS. 2A-C illustrate an exemplary PMOS device and its operation.

Referring to FIGS. 1A-C, an NMOS device includes two n-type regions separated by a p-type substrate. The NMOS device is switched on and off by applying different inputs to the gate so that current flows between source and drain terminals. NMOS devices pass a low output or logical 0 when the logical value at the gate is high or logical 1. When the gate is logical 1, the NMOS passes a weak logical 1 value, which may or may not be interpreted as a logical 1, depending on factors such as threshold voltage of the MOS device and the voltage of the power source that drives logical 1.

Referring to FIGS. 2A-C, a PMOS device includes two p-type regions separated by an n-type substrate. PMOS devices pass a high output or logical 1 when the logical value at the gate is low or logical 0. Further, when the gate is logical 0, the PMOS passes a weaker logical 0 value. PMOS and NMOS devices can be used together to guarantee that the output of a circuit is always a strong 1 or a strong 0. For example, a PMOS and an NMOS which connect the same two nets and have invert-equivalent gates will always be on or off at the same time, and will pass both logical 1 and logical 0 strongly.

The following table of known a known four-value logic value system that is applicable to MOS devices, including NMOS and PMOS devices, illustrates various logic states, levels and values:

| Logic State | Logic Level | Logic Value |
| --- | --- | --- |
| 1 | One | One |
| 0 | Zero | Zero |
| X | Both 0 and 1, Error | Error |
| Z | Not defined | High Impedance |

The strength with which a MOS device passes a weak value is a function of, for example, device width and process parameters that are not generally available in a transistor netlist. The "strength" of a signal can be represented in the following table in accordance with IEEE Standard 1164-1993:

| Logic State | Logic Value |
| --- | --- |
| 1 | Strong High |
| 0 | Strong Low |
| L | Weak Low |
| H | Weak High |
| X | Strong Unknown |
| W | Weak Unknown |
| Z | High Impedance |
| — | Don't Care |
| U | Uninitialized |

Verilog has a separate logic strength table with logic strengths ranging from "high impedance" (strength number=0) to "supply drive" (strength number=7). For purposes of explanation, this specification refers to "0," "1," "X" and "Z" logic states and "strong" and "weak" strengths.

Persons skilled in the art will appreciate that embodiments can be used with various types of MOS devices, including but not limited to, CMOS, NMOS, PMOS, used in circuits of various logic styles, including but not limited to, pass transistor logic, transmission gates, multiple-output domino logic, static MOS circuits and dynamic MOS circuits. This specification and the Figures generally refer to a MOS or MOS device for purposes of explanation, not limitation, and the term MOS device as used in this specification is defined to include these and other types of MOS devices.

Figure 3:
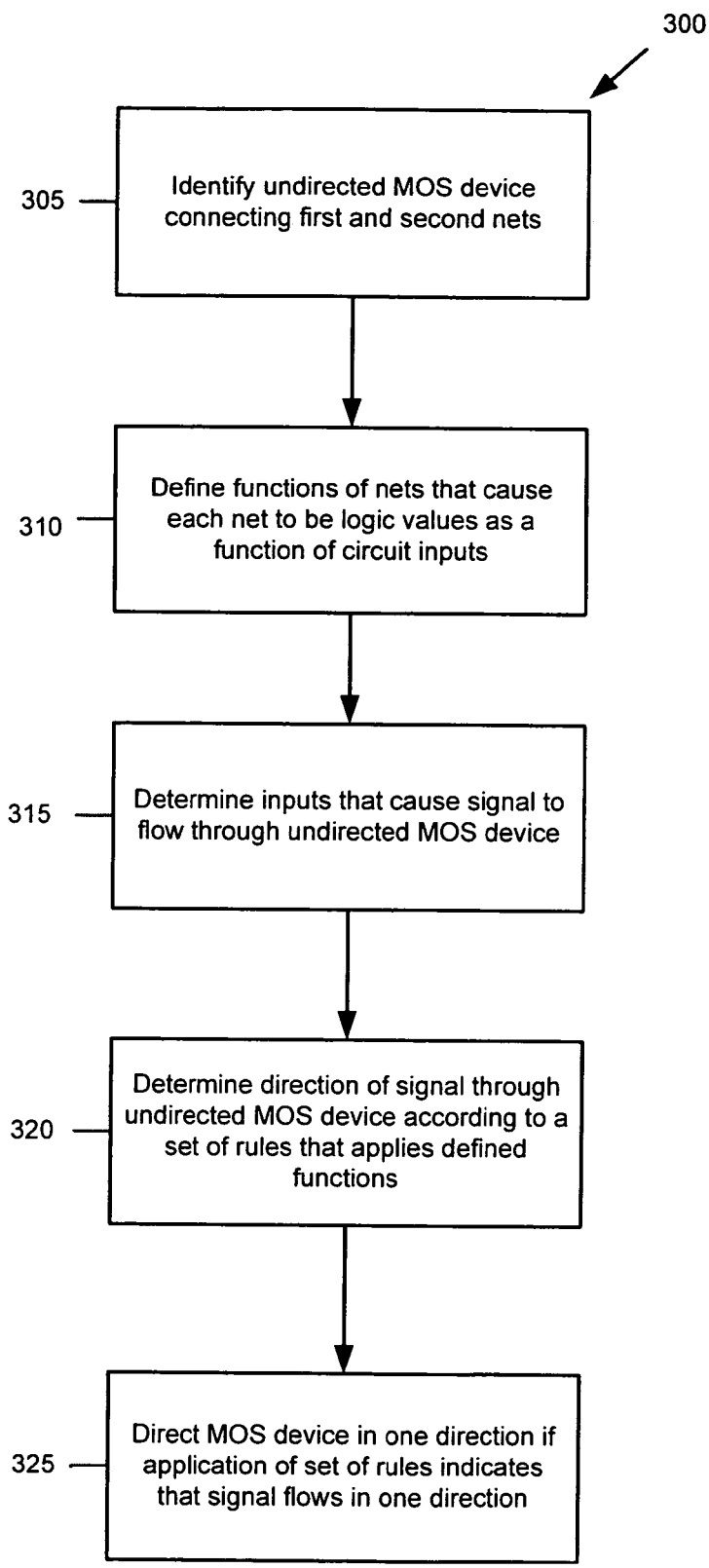
FIG. 3 is a flow chart illustrating a method of directing MOS devices according to one embodiment.

Referring to FIG. 3, one embodiment of the invention is directed to a method 300 for analyzing a MOS device by setting a direction in which a signal flows through the MOS device. In step 305, MOS devices in a circuit that are not directed are identified. A MOS device links two nets. In step 310, functions of nets that cause each net to be logic values as a function of circuit inputs are defined. In step 315, inputs that cause a signal to flow through an undirected MOS device are determined. In step 320, the direction of the signal that flows through the undirected MOS device is determined according to a set of rules or conditions that applies defined functions. Whether the rules or conditions are satisfied indicates whether the signal flows through the MOS device in one direction or two directions.

In step 325, if application of the rules results in a determination the MOS device is directed that the signal flows in one direction. The MOS device is directed in the same direction as the signal flow direction. Thus, subsequent processing and analysis of directed MOS devices can be simplified since it is not necessary to analyze the directed MOS devices with respect to signals that could flow in both directions. These benefits become more significant as larger circuits with greater numbers of MOS devices are analyzed, and with chains of linked or related MOS devices, e.g., the results of analyzing one MOS device are used to analyze another MOS device, and so on, for a chain of MOS devices.

Figure 4:
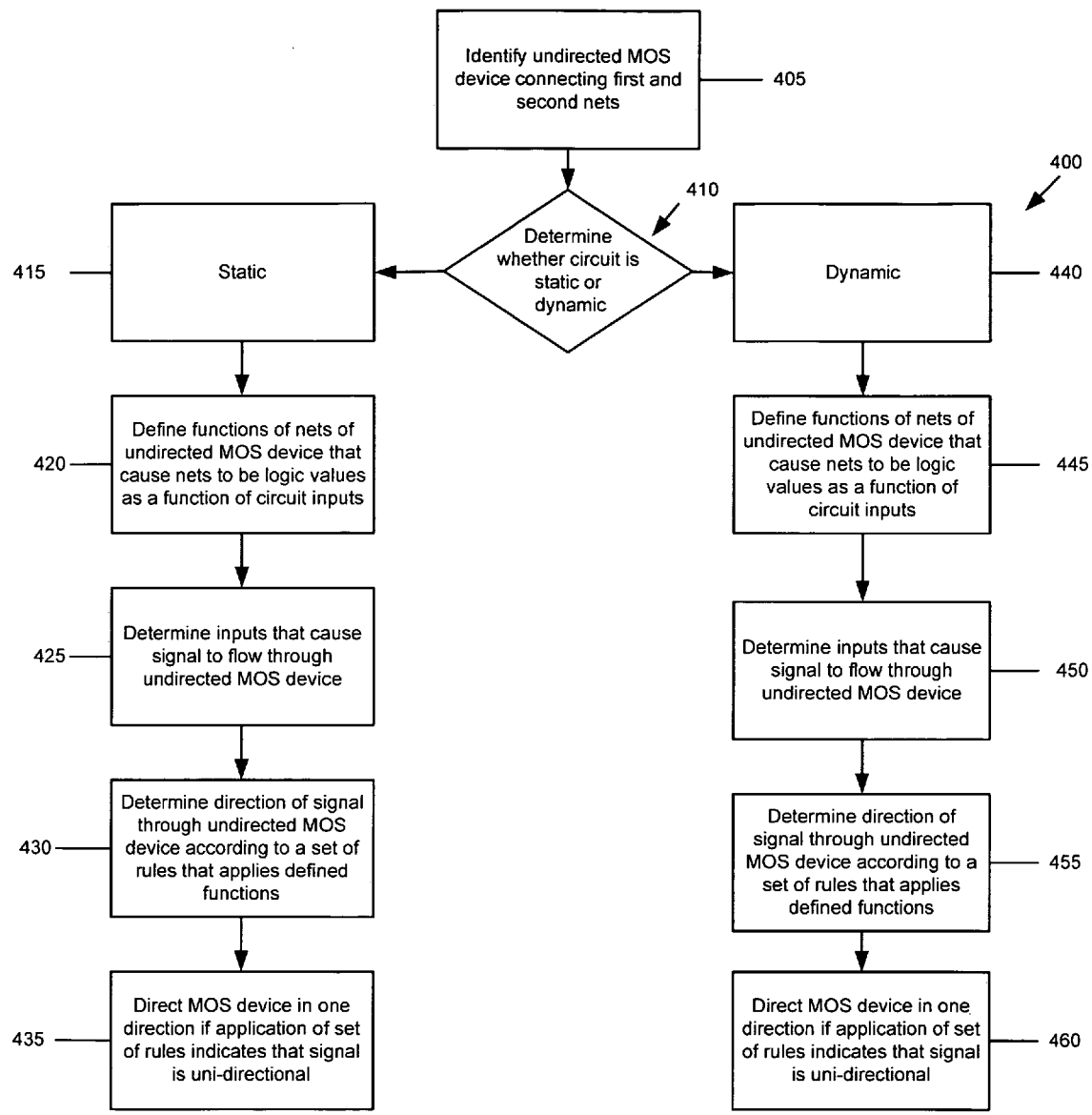
FIG. 4 is a flow chart illustrating methods of directing MOS devices in static and dynamic circuits according to alternative embodiments.

Referring to FIG. 4, embodiments can be applied to both static MOS circuits, as well as dynamic MOS circuits. A static MOS circuit is a circuit composed of MOS devices that does not have any pre-charged nets, e.g., no nets have precharge clocks. A dynamic MOS circuit is a circuit composed of MOS devices that has at least one pre-charged net, and a clock net which causes precharge nets to be charged to 1 or 0. Different functions and rules can be used to determine whether MOS devices in static and dynamic circuits can be directed.

In step 405, an undirected MOS device is identified. The MOS device links first and second nets. In step 410, a determination is made regarding whether the undirected MOS device is in a static or dynamic circuit. Steps 435, 415 relate to a static circuit, and steps 440-465 relates to a dynamic circuit.

If the device is static 415, then in step 420, functions of nets of the undirected MOS device that cause each net to be logic values as a function of circuit inputs are defined. In step 425, inputs that cause a MOS device to conduct so that a signal flows through the undirected MOS device are determined. In step 430, the direction of the signal that flows through the undirected MOS device is determined based on a set of rules or conditions that apply one or more defined functions suitable for static device. Satisfying the rules or obtaining certain results from applying the rules indicate whether the signal flows through the MOS device in one direction. In step 435, the undirected MOS device is directed in one direction if it is determined that the signal is uni-directional as a result of applying the rules or conditions. Preferably, the MOS device is directed in the same direction as the signal flow.

Otherwise, it is determined that the undirected MOS device is within a dynamic circuit 440, and in step 445, functions of nets of undirected MOS devices that cause each net to be logic values as a function of circuit inputs are defined. In step 450, inputs that cause signal to flow through undirected MOS device are determined, and in step 455, a set of rules or conditions is applied to determine whether the signal flows in one direction or two directions. The rules apply defined functions. According to one embodiment, the functions used to analyze static devices are different than the functions and rules that are used to analyze dynamic devices. Further, in one embodiment, the rules or conditions are different for static devices and dynamic devices. In step 460, the previously undirected MOS device is directed in one direction if application of the set of rules indicates the signal is uni-directional. Preferably, the direction is the same as the signal flow.

Figure 5:
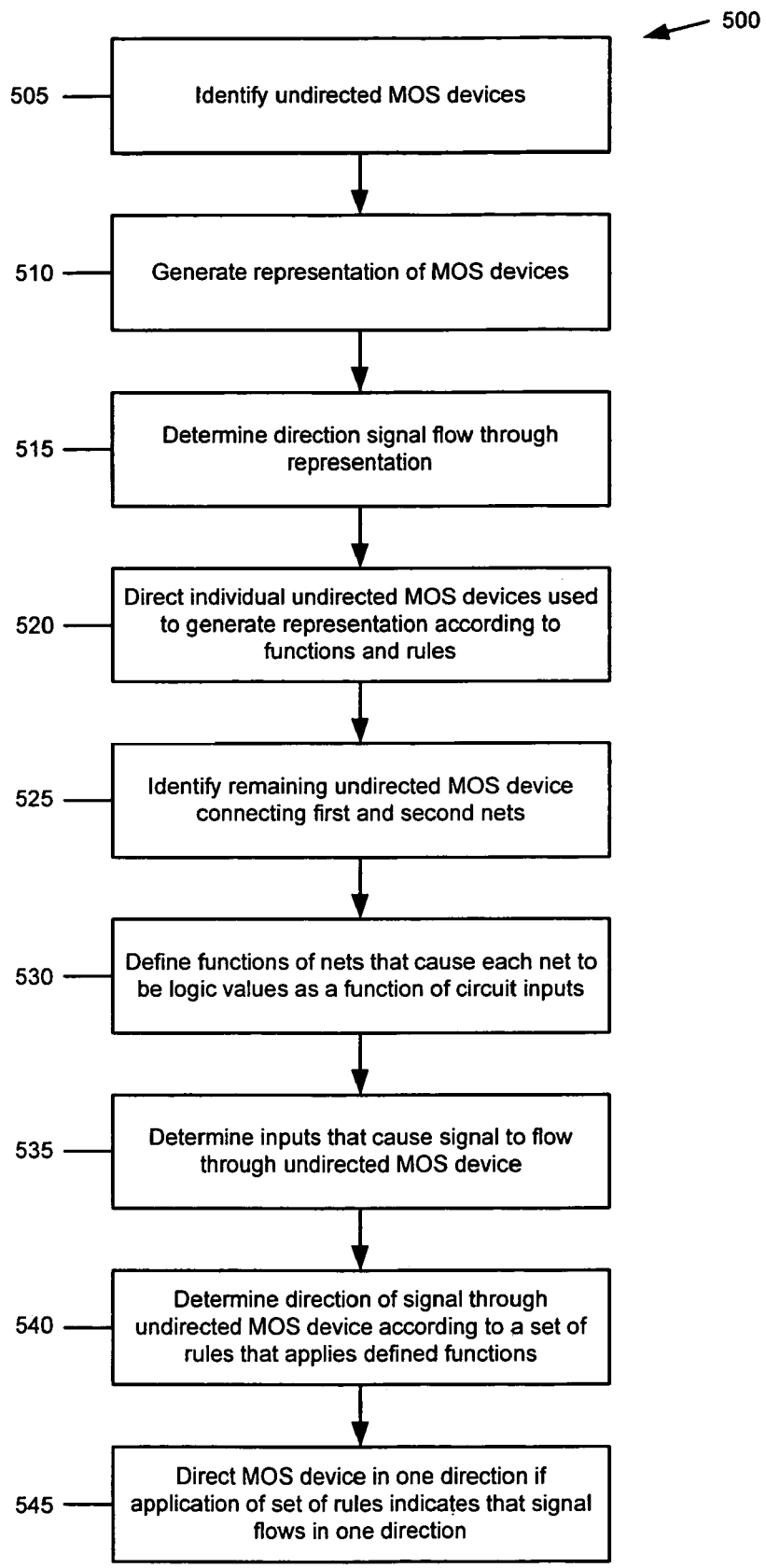
FIG. 5 is a flow chart illustrating how a circuit can be pre-processed and undirected devices are analyzed according to embodiments of the invention.
Figure 6:
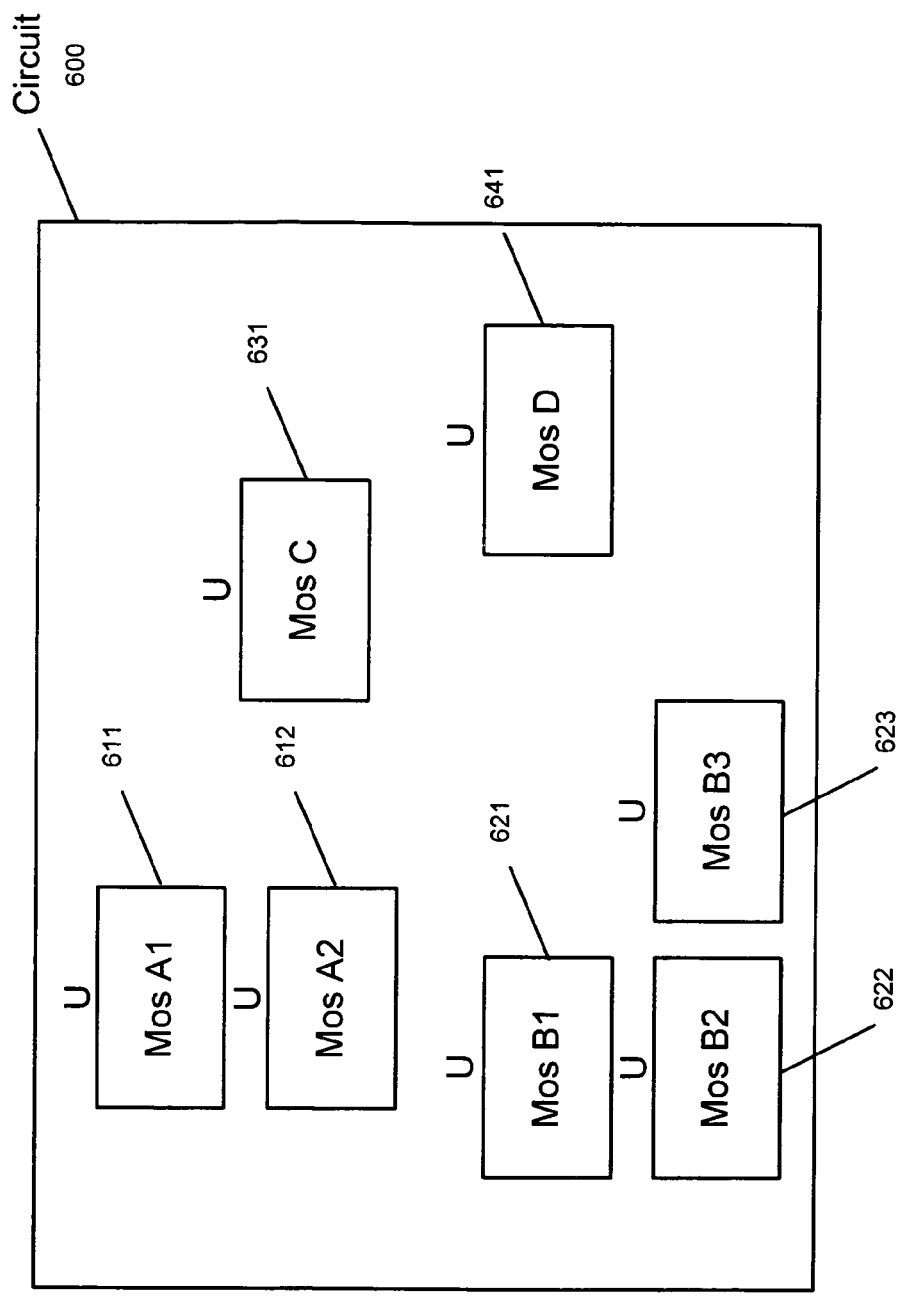
FIG. 6 is a block diagram of a circuit with various MOS devices.

Referring to FIGS. 5-8, the circuit having MOS devices can be pre-processed before direction analysis is performed. For example, a circuit 600 of MOS devices can be reduced using series-parallel reduction, and parallel nMOS and PMOS devices with invert-equivalent gate inputs can be merged into a transmission gate. In one embodiment, a method 500 includes identifying like or similar undirected MOS devices in step 505. As shown in FIG. 6, MOS devices A1 611 and A2 612 are like devices, and MOS devices B1 621, B2 622 and B3 623 are like devices, and MOS C 631 and MOS D 641 are different than the other devices. For purposes of explanation, these devices are identified as undirected ("U").

Figure 7:
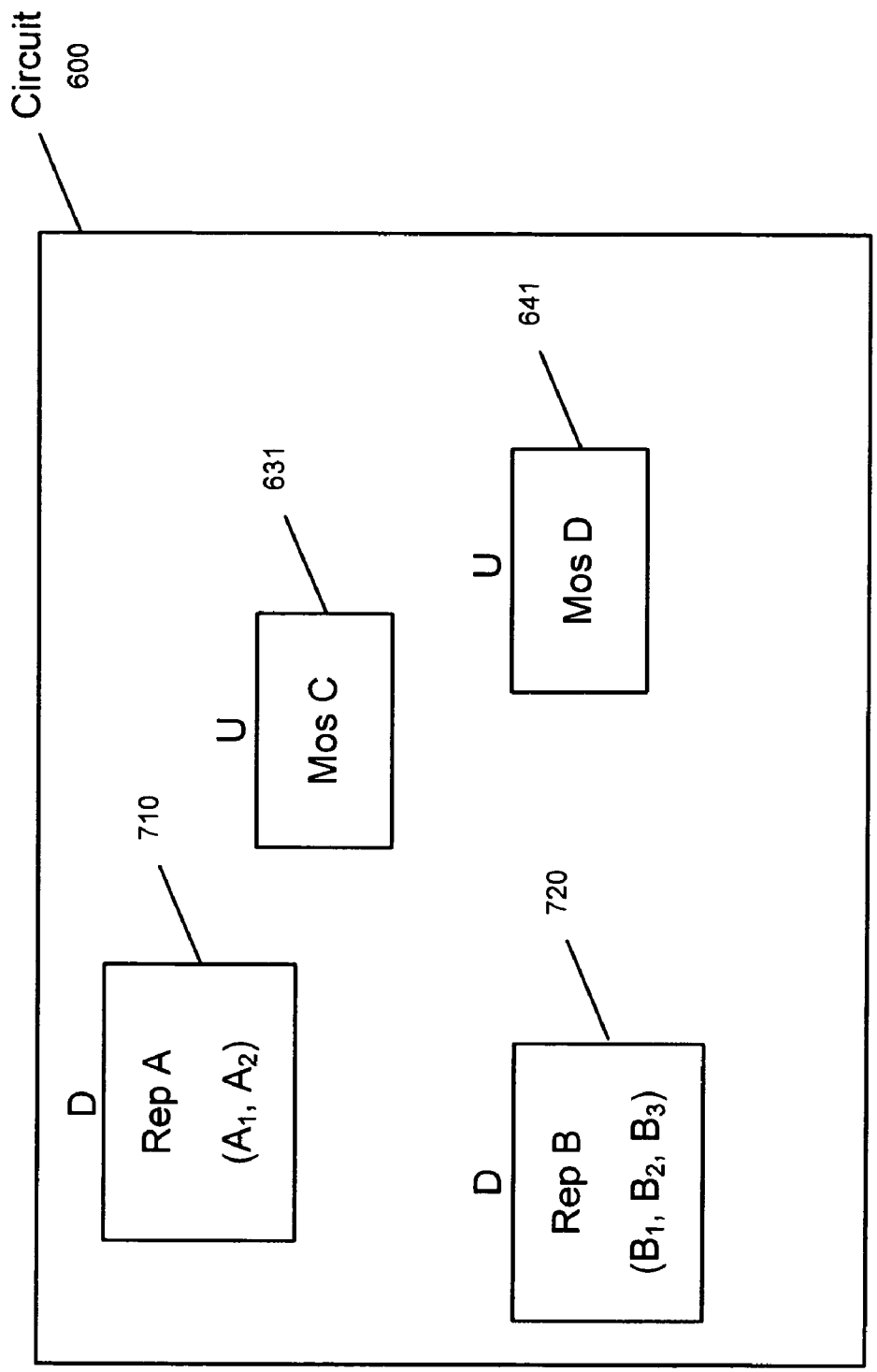
FIG. 7 a block diagram of the circuit shown in FIG. 6 including representations that are generated for MOS devices which can be combined into a singe representative MOS device by methods such as series-parallel reduction, and a direction of a signal that flows through the representations.

Referring to FIGS. 5 and 7, a representation of like or similar MOS devices can be generated in step 510. As shown in FIG. 7, representation A 710 is generated from MOS devices A1 and A2, and representation B 720 is generated from MOS devices B1, B2, and B3. In step 515, the direction of the signal that flows through the representation is determined by local topological rules when possible. In step 520, individual MOS devices that were used to generate a representation are directed according to the direction assigned to the representation. This is shown by changing the "U" to be directed ("D"). The direction of a signal through the first representation 710 is determined and appropriately directed, and the direction of a signal through the second representation 720 is determined and appropriately directed.

Figure 8:
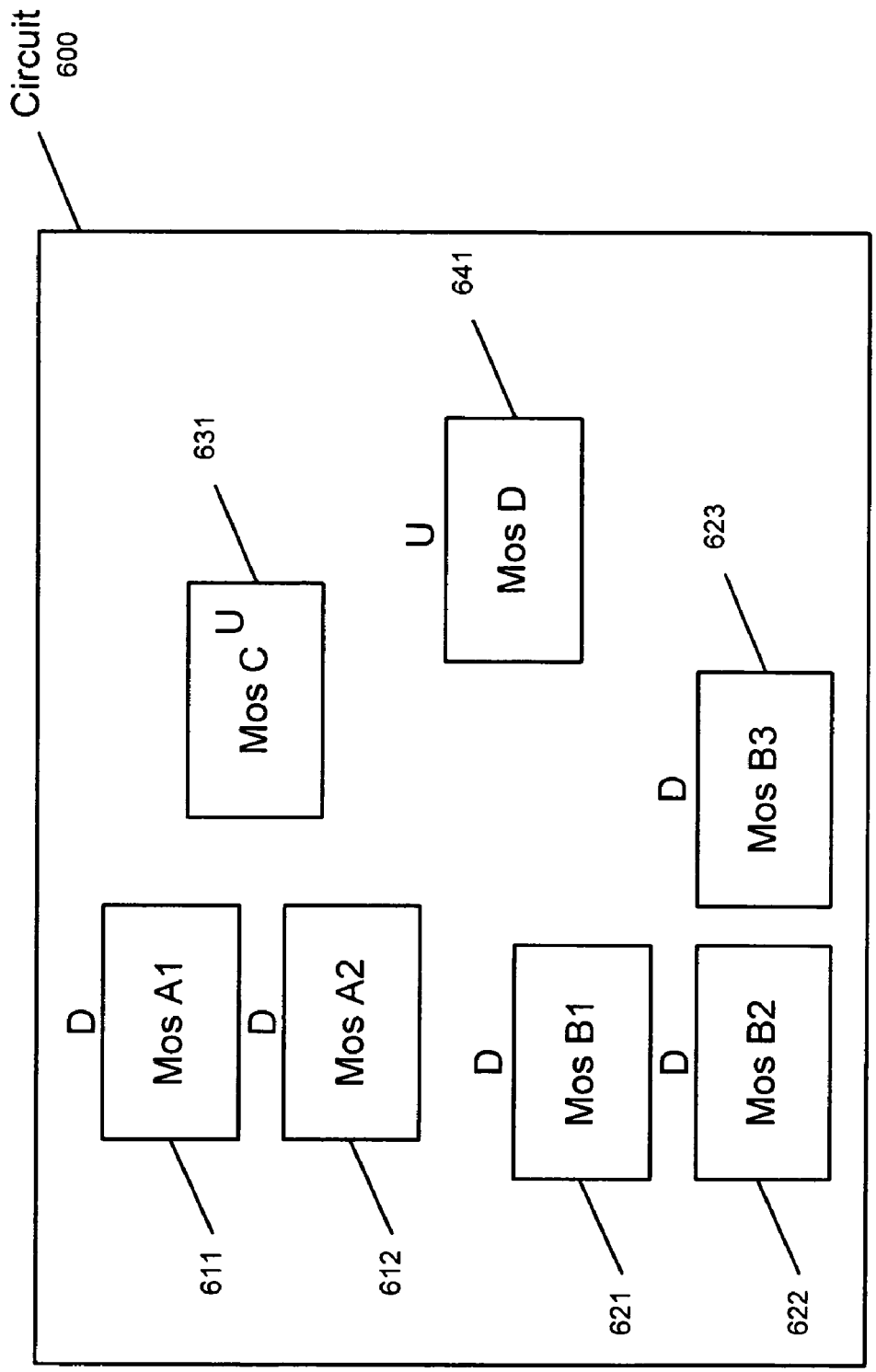
FIG. 8 is a block diagram showing MOS devices being directed according to the direction of a signal through a corresponding representation.

As shown in FIG. 8, individual MOS devices that were used to generate a representation are directed according to the direction of a signal through that representation (indicated by "D"). Thus, MOS A1 611 and MOS A2 612 are directed according to the direction of the first representation 710, MOS B1 621, MOS B2 622 and MOS B3 623 are directed according to the direction of the second representation 720. However, MOS C 631 and MOS D 641 remain undirected, and remaining steps 525-545 are applied to the undirected MOS devices, MOS C 631 and MOS D 641, in a similar manner as shown in FIG. 3. Thus, in step 525, the remaining undirected MOS devices are identified, and in step 530, the functions of nets that cause each net to be logic values as a function of circuit inputs are defined. In step 535, inputs that cause a signal to flow through an undirected MOS device are determined. In step 540, a determination is made regarding the direction of the signal that flows through the undirected MOS device according to a set of rules or conditions that applies determined functions. In step 545, the MOS device is directed in one direction if it is determined that the signal flows in one direction as a result of applying the set of rules. Preferably, the MOS device is directed in the same direction as the signal flow. Further aspects of embodiments of the invention are described with reference to FIGS. 9-18. Persons skilled in the art will appreciate that these general block and circuit diagrams and flowcharts are provided as example circuits to which embodiments can be applied, and that embodiments can be used with various circuits.

Figure 9:
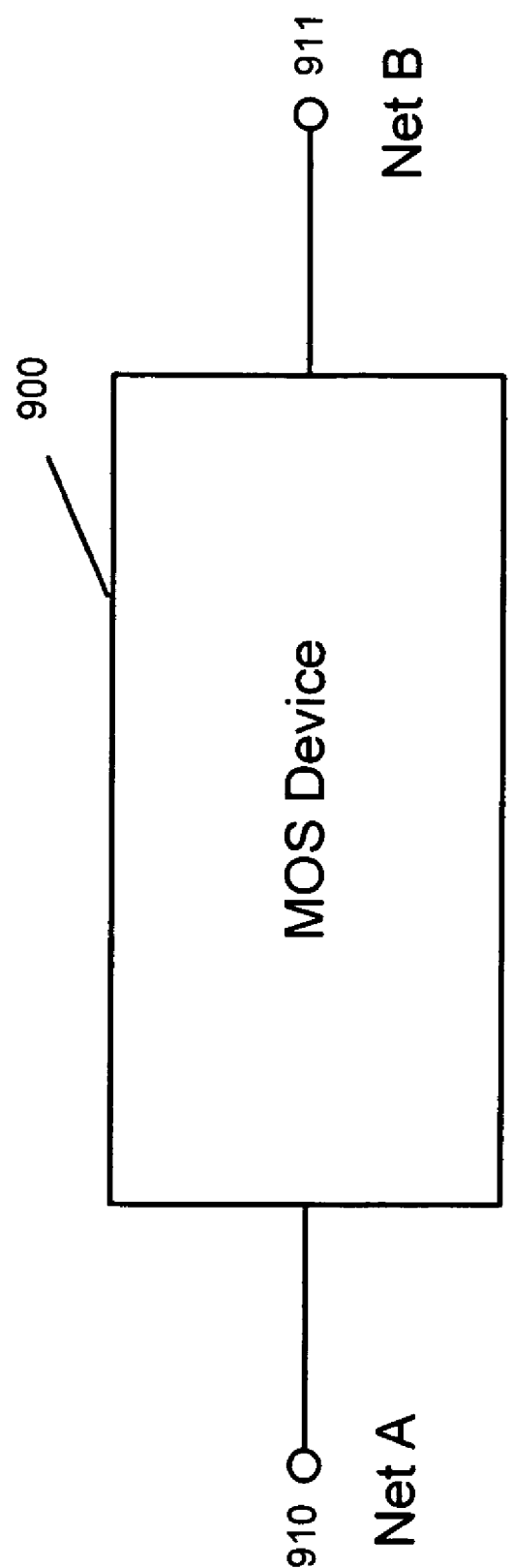
FIG. 9 is a block diagram of a MOS device linking two nets.

Referring to FIG. 9, embodiments of the invention are generally directed to analyzing logic values of nets that are connected by a MOS device 900. The MOS device is shown as linking two nets, Net A 910 and Net B 912 (generally "net" 910). The nets 910 are connected to the source and drain of the MOS device 900 (as shown in FIGS. 1B and 2B).

Figure 10:
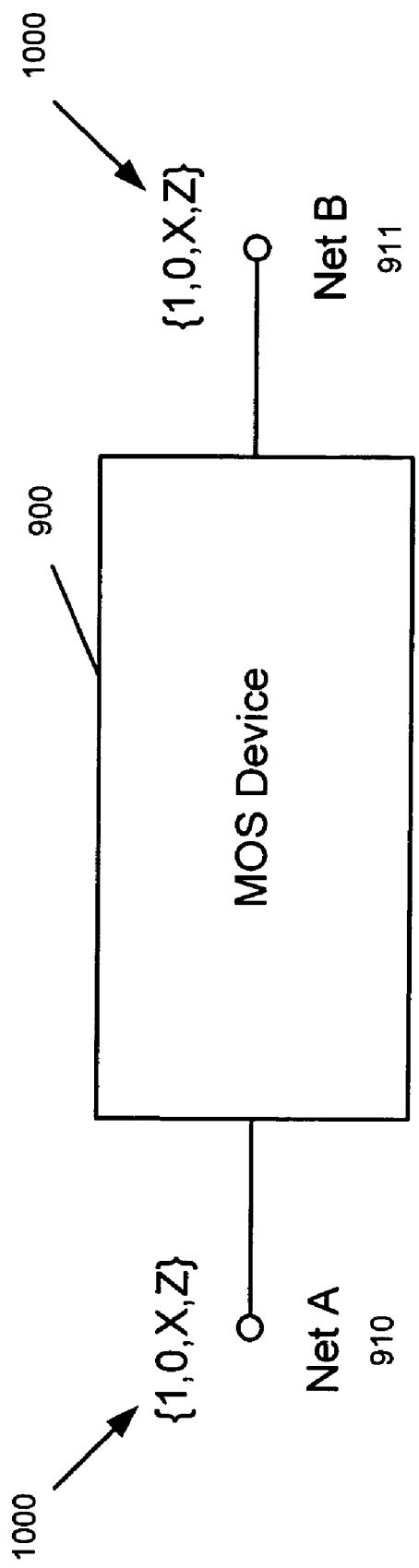
FIG. 10 is a block diagram of a MOS device linking two nets and showing nets having a value according to a 4-value logic system as a function of circuit inputs.

Referring to FIG. 10, the logical function at each net 910 is identified. A according to one embodiment, the logic functions 1000 can have values $\{1, 0, X, Z\}$, depending on the input to the circuit. Persons skilled in the art will appreciate that other logic systems could be utilized, and that this specification refers to $\{1, 0, X, Z\}$ for purposes of explanation, not limitation. These functions can be used, with a set of rules to direct static and dynamic devices.

Directing MOS Devices in Static Circuits

Figure 11:
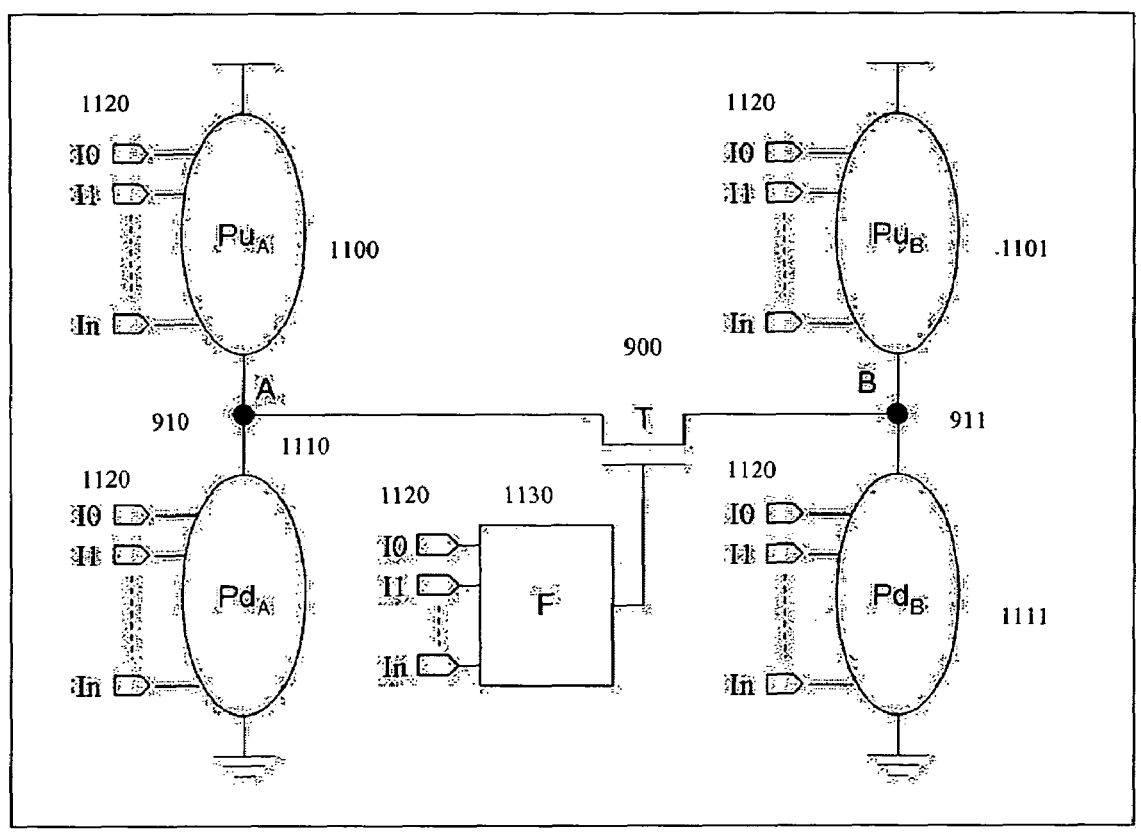
FIG. 11 is a circuit diagram illustrating a MOS device in a static circuit and pullup and pulldown functions.

Referring to FIG. 11, embodiments of the invention can be applied to MOS devices 900 in circuits that are static, i.e. they do not have pre-charged nets or clocks. The MOS device 900 is shown as element T, and drain and source of T are connected to net A 910 and net B 911.

Figure 12:
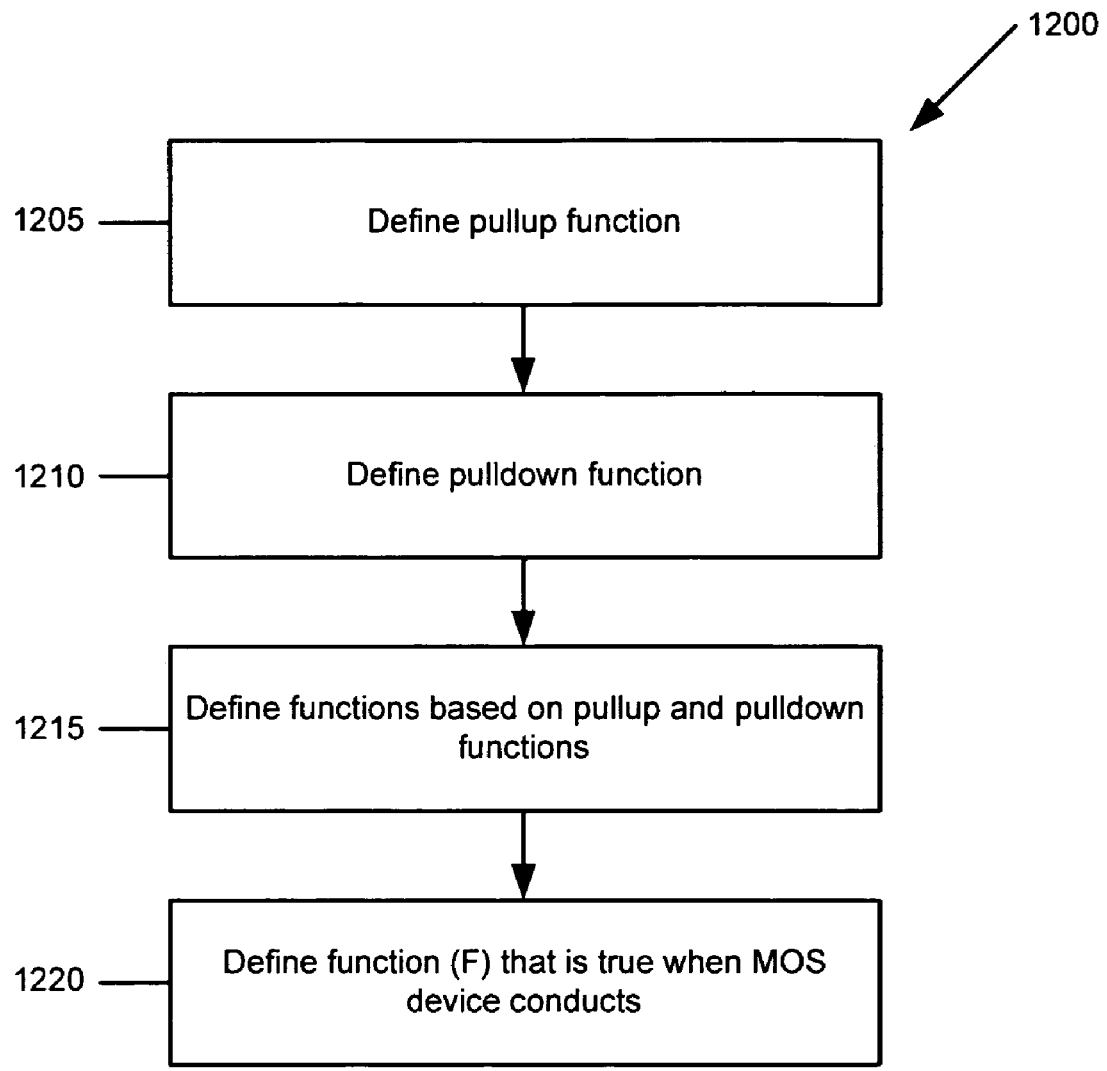
FIG. 12 is a flow chart illustrating defining functions for a MOS device in a static circuit.

Referring to FIG. 12, pullup functions (Pu) 1100 and 1101 (generally 1100) and pulldown functions (Pd) 1110 and 1111 (generally 1110) are used to define functions of nets that cause each net to be logic values (step 310 of FIG. 3), or to determine the set of ways that net A 910 and net B 911 can be any of $\{1,0,X,Z\}$ as a function of the circuit's inputs, which are represented as inputs Io, I, . . . In (1120). Thus, defining the functions can include defining a pullup function 1100 in step 1205, defining a pulldown function 1110 in step 1210 and defining functions $\{1, 0, X, Z\}$ based on those pullup and pulldown functions in step 1215. In step 1220, a function (F) can be defined that is true if it causes a MOS device to conduct. The rules or conditions that are used to determine the direction of a signal apply the pullup and pulldown functions 1100 and 1110 and the function (F).

More specifically, the pull-up function 1100 pulls the net 910 to a high value. A pullup function 1100 of a net 910 maps each of the possible inputs 1120 to a circuit to true if and only if that input will cause a conducting path from VDD to net 910. Thus, a pullup function 1100 is true if an input causes a net 910 to be pulled to 1. A pull-down function 1110 for the net 910 maps each circuit input to true if and only if that input will cause a conducting path from ground to net 910, pulling the net to a low value. Thus, a pulldown function 1110 is true if an input causes a net 910 to be pulled to 0. Pullup and pulldown functions 1100 and 1110 are determined without having to use a path through a MOS device 900.

FIG. 11 illustrates two pullup and pulldown functions, one of each for each both nets A and B. Net A 910 includes pullup function Pua 1100 and pulldown function Pda 1110, and Net B 911 includes pullup function Pub 1101 and pulldown function Pdb 1111. The gate of T 900 is connected to the function (F) 1130, which is true if it causes a signal to flow through T 900. For NMOS devices, the function (F) 1130 is the logical function at the gate, whereas for PMOS devices, the function (F) is the inverse of the function at the gate.

Once pullup and pulldown functions 1100 and 1110 of a net 910 are determined, functions of the circuit's inputs that make that net any of $\{1,0,X,Z\}$ can be constructed or defined. However, because a signal cannot flow through a MOS device when the device is inactive, it is not necessary to consider the logical value of the nets when T is off. The following functions {Zn, 0n, 1n, Xn} for Net A and Net B are defined as follows:

$$Za = \sim PUa \cdot \sim Pda$$

$$0a = \sim PUa \cdot Pda$$

$$1a = PUa \cdot \sim Pda$$

$$Xa = PUa \cdot Pda$$

$$Zb = \sim Pub \cdot \sim PDb$$

$$0b = \sim Pub \cdot PDb$$

$$1b = Pub \cdot \sim PDb$$

$$Xb = Pub \cdot PDb$$

The symbol "~" is Boolean negation, and "·" is the Boolean AND operator.

A set of rules or conditions based on the above-defined functions is used to determine whether the signals that flow through a MOS device flow in one direction or two directions (e.g., step 320 of FIG. 3). In static circuits, it can be determined that a signal flows in one direction if the following rules or conditions are satisfied:

| | | |
|---|---|---|
| 1) $F \cdot X_A$ = false | AND | $F \cdot X_B$ = false |
| 2) $F \cdot 0_A \cdot 1_B$ = false | AND | $F \cdot 1_A \cdot 0_B$ = false |
| 3) $(F \cdot 1_B \neq F \cdot 1_A)$ | OR | $(F \cdot 0_B \neq F \cdot 0_A)$ |
| 4) $F \cdot 0_B \rightarrow F \cdot 0_A$ | | |
| 5) $F \cdot 1_B \rightarrow F \cdot 1_A$ | | |

Alternative embodiments can utilize other logically equivalent rules to the five exemplary rules provided above. For purposes of explanation, reference is made to these five rules.

The variables in the above predicates are functions from a set of boolean values (circuit inputs) to a single boolean value. The operator '·' is logical AND, so that the function $F \cdot 0_B$ is the function that is true for all inputs that make F true, and make $0_B$ true. '→' is the implication operator. X→Y is true if there is no input to the functions X and Y that makes X true and Y false. The operator '≠' tests that two functions are not identical. X≠Y if there is some input that makes X true and Y false, or vise versa. '=false' is a test of satisfiability. X=false if every input to the function X maps to false.

These five rules or conditions can be used for static circuits to guarantee that there exists some input that causes a signal to flow from net A to net B, and that no inputs cause a signal to flow in the opposite direction. Accordingly, if all five rules are satisfied as set forth above, then the direction of the MOS device can be set. Each of these five rules is discussed in further detail below.

Rule 1 ($F \cdot X_A$=False AND $F \cdot X_B$=False) (Static Device)

Rule or Condition 1 confirms that Net A and Net B cannot be pulled to both 1 and 0 while the MOS device T conducts. Because no signal can flow through MOS device T when the input function (F) is false, a determination is made that $F \cdot X_n$ is false, rather than $X_n$. Generally, a correctly designed circuit will not drive a net to both 1 and 0 at the same time.

Rule 2 ($F \cdot 0_A \cdot 1_B$=False AND $F \cdot 1_A \cdot 0_B$=False) (Static Device)

The second rule or condition confirms that no input to the circuit exists that connects net A and net B when one net is 0 and the other net is 1. If any input to the circuit causes function F to be true, then mos device T (900) will conduct when this input is applied. If function 0a is true, then net A is driven to 0. If function 1b is true, then net B is driven to 1. If the AND of these functions can be made true by some input, then all are true for that input, meaning that net A is 0, net B is 1, and T is conducting. If any input causes this behavior, then direction can not safely be set. Rule 2 verifies that no such input exists.

For example, if the result of rule 2 were true, one net were 0 and the other net were 1, then a path from Vdd to ground would exist. For example, if A=1 and B=0, then a path exists from Vdd to A, through T to B, and from B to ground. In this case, the determination of the logical value of net A and net B typically requires knowledge of other MOS device parameters, such as the resistance of the MOS devices, their Vt value, the voltage difference from Vdd to ground, etc., and such information is typically omitted from a netlist. Thus, it would not be appropriate to direct a MOS device.

Rule 3 (($F \cdot 1_B \neq F \cdot 1_A$) OR ($F \cdot 0_B \neq F \cdot 0_A$)) (Static Device)

In rule or condition 3, the logic "OR" requires that one of the conditions of rule 3 be satisfied in order to direct a MOS device. If condition 3 is not satisfied, then net A and net B always have the same logical value while MOS device T is conduction, and no signal flows in either direction.

Rule 4 ($F \cdot 0_B \rightarrow F \cdot 0_A$) (Static Device)

Rule or condition 4 ensures that there is no input that makes B=0 and A≠0. If B=0 and A=Z, then B drives A to 0, and a signal flows from B to A, and the direction of the MOS device cannot be set from A to B. This condition can be violated in three ways: 1. A=1, 2. A=Z, and 3. A=X. The third violation, A=X, also would fail to satisfy rule 1 would not pass rule 1. The first violation, A=1, would fail to satisfy rule 2.

Rule 5 ($F \cdot 1_B \rightarrow F \cdot 1_A$) (Static Device)

Rule or condition 5 checks to ensure that there is no input that makes B=1 and A≠1. If B=1 and A=Z, then a signal flows from B to A, so MOS device T cannot be directed from A to B.

Observability Test

There may be cases when application of the rules or conditions results in a determination that a signal is bi-directional and flows in two directions through a MOS device. The MOS device may nevertheless be directed in one direction if the bi-directional signal is observable in only one direction, i.e., the bi-directional signal cannot be observed at an output. For example, in logical abstraction, the end result is a set of logic gates that model the function of the circuit. If signal can flow through a MOS device, but that signal flow can not influence any net that is a circuit output, then the logical function of the circuit will not be altered if the MOS device is directed. Thus, a bi-directional signal may have uni-directional observable behavior and, therefore, can be directed in one direction.

Figure 13:
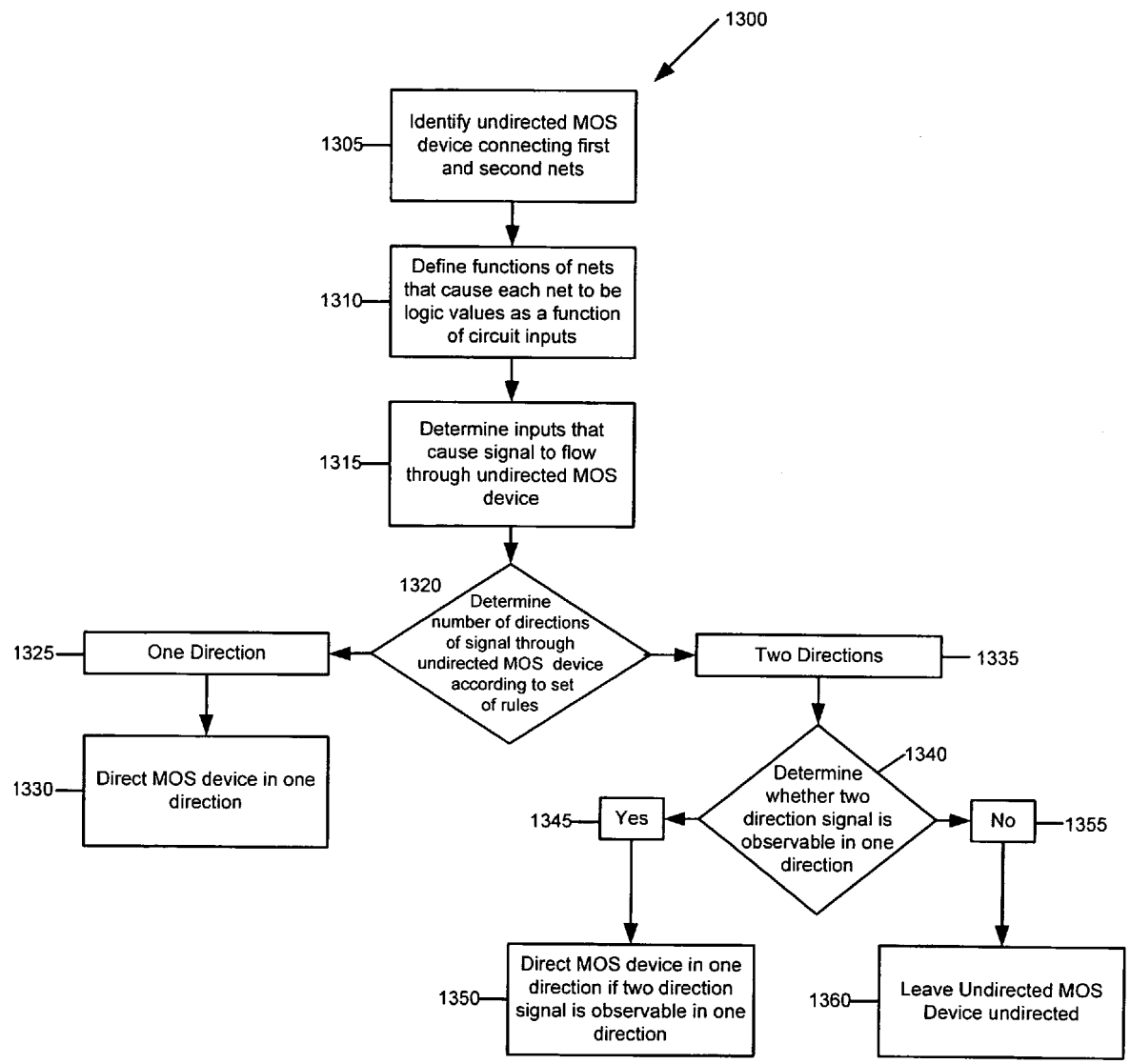
FIG. 13 is a flowchart illustrating setting a direction based on signal flow and observability according to one embodiment.

FIG. 13 illustrates a method 1300 of directing a MOS device by considering both signal direction and observability. In step 1305, an undirected MOS device linking two nets is identified. In step 1310, functions of nets that cause each net to be logic values as a function of circuit inputs are defined, as discussed above. In step 1315, inputs that cause signal to flow through undirected MOS device are determined, and in step 1320, rules or conditions are applied using the defined functions to determine the signal flow direction and whether the flow is uni-directional or bi-directional. If the signal flow is uni-directional, 1325 then the MOS device can be directed. If the signal flow is bi-directional 1335, then in step 1340 a determination is made whether the bi-directional signal is observable in only one direction. If so 1345, in step 1350, then the MOS device can be directed. If not 1355, the bi-directional signal has bi-directional observability and is observable at more than one output. In this case, the MOS device can remain undirected 1360.

For example, when analyzing a static circuit, if rules 1, 2, and 3 pass, but one or both of rules 4 and 5 fail, then there is an input that causes the MOS device T conduct, A=Z and B is in {0,1}. This results in a value at B driving A through T and a bi-directional signal. In order for B to drive a value onto A, it must be the case that T conducts, A=Z, and B is in {0,1}. The function $F \cdot Z_A \cdot (0_B + 1_B)$ (where '+' is the boolean OR operator), therefore, must be true.

In order to test observability, a function that is true if signal flows from B to A through T is constructed, and a circuit graph can be traversed from A to determine if the value that B drives onto A can be observed when that function is satisfied. A search from net A is run on the circuit graph to determine if any path exists from A to any output net in the graph. Paths do not include edges whose corresponding MOS device will not conduct when the function $F \cdot Z_A (0_B + 1_B)$ is true. If A can not be observed, then the MOS device T can be directed.

A search of all paths through the circuit starting from net A can be performed. For example, this search could be done in a breadth-first manner, as is known in the art. At each net, only those MOS devices that conduct when the function is true are followed. The value at A is considered observable if any node that drives a device outside the circuit is reached.

Directing MOS Devices in Dynamic Circuits

Figure 14:
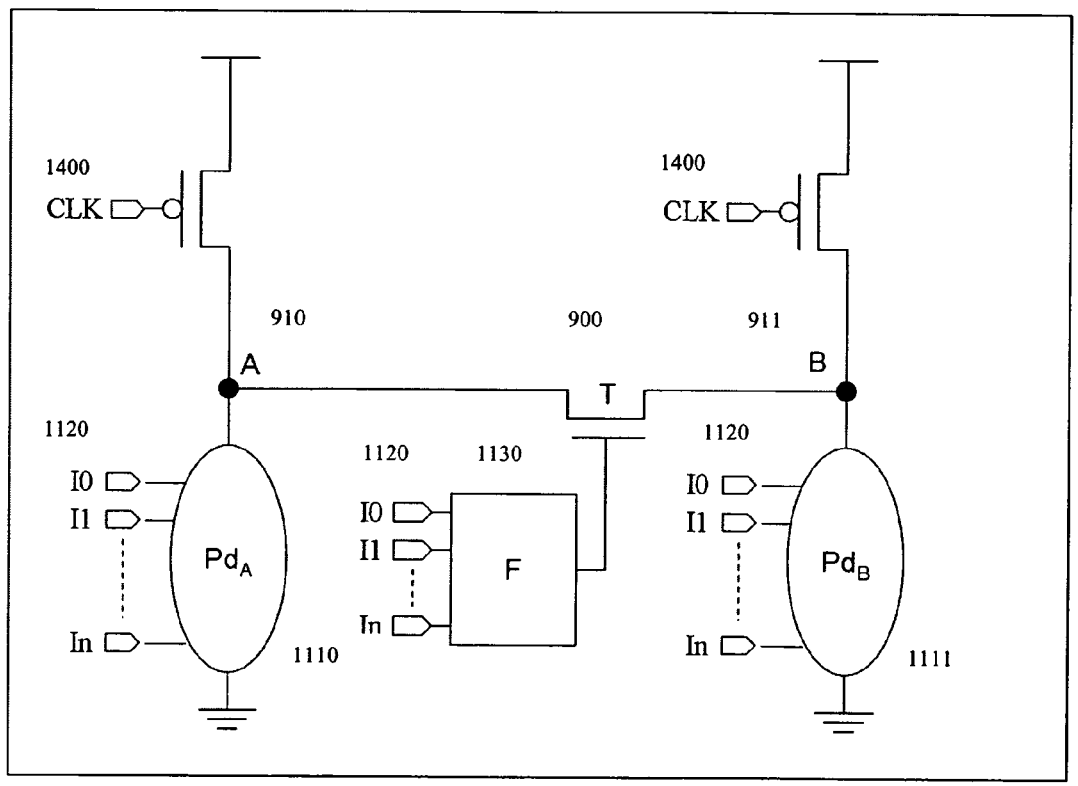
FIG. 14 is a circuit diagram illustrating a MOS circuit with a pre-charged net.

Referring to FIG. 14, embodiments of the invention can also directed MOS devices in dynamic circuits having one or more pre-charged nets. FIG. 14 shows a MOS device T 900, which links nets A and B 910 and 911. Both nets A and B 910 and 911 are precharged to 1 by a clock CLK 1400. The circuit also includes a pulldown function (Pd) 1110 between each net and ground. Thus, rather than a pullup function, as used in static circuits clocks 1400 are used to pre-charge the nets.

Figure 15:
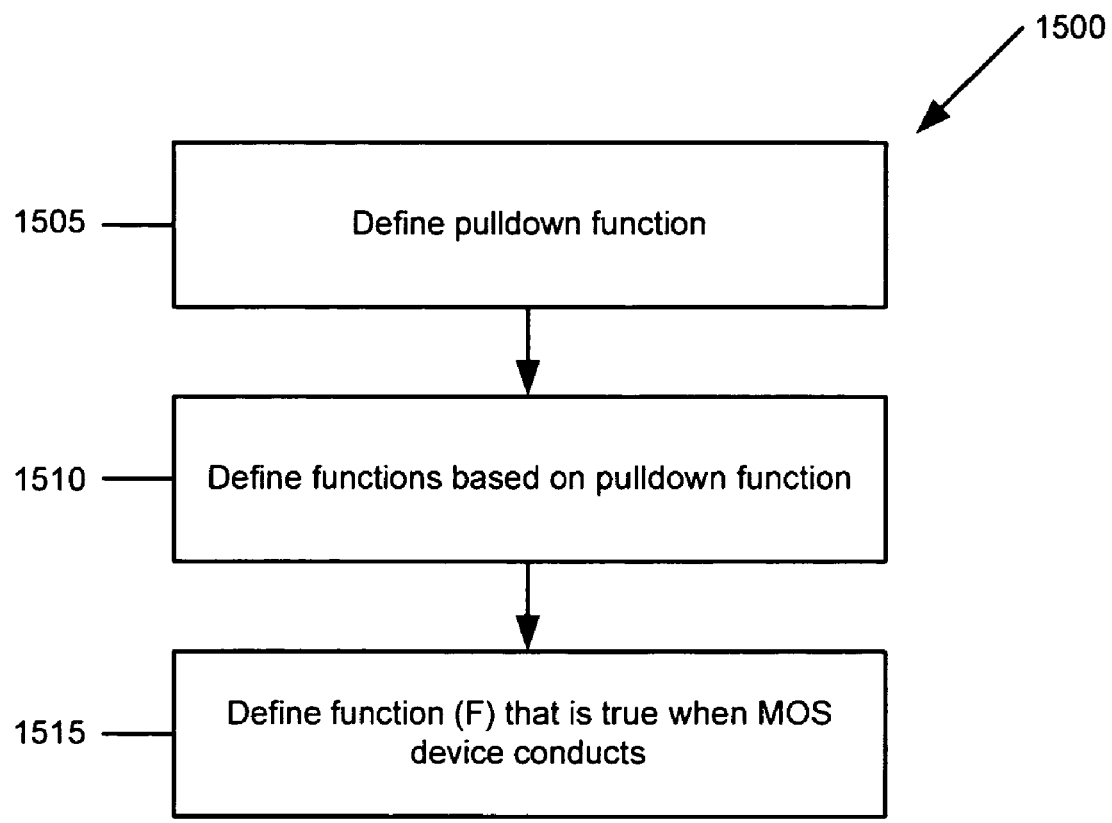
FIG. 15 is a flow chart illustrating defining functions for a MOS device in a dynamic circuit.

Thus, referring to FIG. 15, a pulldown function is defined in step 1505, and functions {X, 0, 1, Z} are defined based on the pulldown function. In step 1510, a function (F) is defined as true when the MOS device conducts. Inputs that cause the MOS device to conduct are determined, and using these functions, the direction of the signal that flows through the MOS device is determined based on the set of rules.

Referring again to FIG. 14, when the clock is 0, A and B are pre-charged to 1, and when the clock is 1, A and B can be pulled to 0. Net A is defined to be 0 if it is pulled to 0, and 1 if it is not pulled to 0 as follows:

$Z_n$=false $0_n$=$PD_n$ $1_{na}$=~$PD_n$ $X_n$=false

In this table, it is to be understood that 'n' refers to the net for which the function describes (A or B).

The following rules or conditions that apply defined functions can be used to check the direction of MOS device T and whether the direction of T can be set from A to B. These rules are applicable when both nets A and B are pre-charged to 1.

1) $(F \cdot 1_A \cdot 0_B)$=false
2) T strongly passes 0
3) $(F \cdot 0_B) \neq (F \cdot 0_A)$ Alternative embodiments can utilize other logically equivalent rules to the three exemplary rules provided above. For purposes of explanation, reference is made to these three rules.

Rule 1 $(F \cdot 1_A \cdot 0_B)$=False (Dynamic Device)

Rule 1 for dynamic MOS circuits confirms that there is no input that causes T to conduct, A to be precharged, and B to be pulled to 0. In this case, a signal will flow from ground, through B, through T, and to A to discharge the precharge at net A. In this case signal flows from B to A, so direction can not be set from A to B.

Rule 2 (T Strongly Passes 0) (Dynamic)

Rule 2 checks that T can strongly pass 0. If T is a pMOS (which does not strongly pass 0), then the precharged value 1 at A may not be dissipated if T conducts and B is pulled to 0. Therefore, it is not safe to assume that T will conduct.

Rule 3 $((F \cdot 0_B) \neq (F \cdot 0_A))$ (Dynamic)

Rule 3 ensures that A and B are not logically identical when T conducts. If A and B are never different when T conducts, then no signal flows through T for any input.

Similar rules can be derived for a circuit where both A and B are pre-charged to 0 based on reasoning similar to the pre-charged to 1 case discussed above:

1) $(F \cdot 0_A \cdot 1_B)$=false
2) T strongly passes 1.
3) $(F \cdot 1_B) \neq (F \cdot 1_A)$ FIGS. 16-18 illustrates in further detail implementations of embodiments of the invention applied to both static and dynamic circuits.

Static CMOS AND/OR Gate

Referring to FIG. 16, a further example of applying embodiments to a static MOS circuit is provided. In this example, rules are applied to show that MOS device T (which represents the combination of Ta(901) and Tb(900)) can be directed from A to B so that the signal flows towards output $O_1$ 1611 rather than towards output $O_2$ 1610. To show how the rules can fail, rules are applied to test that T can be directed from A to B.

FIG. 16 illustrates a circuit CMOS AND/OR gate 1600 having two MOS devices Ta and Tb 900 and 901. Pre-processing, such as series-parallel reduction can reduce Ta 900 and Tb 901 into a single MOS device T 900. Since the circuit has no pre-charge, the defined functions and set of five rules applicable for static circuits are used to analyze the circuit 1600:

| | | | |
|---|---|---|---|
| Za = | ~PUa | · | ~Pda |
| 0a = | ~PUa | · | Pda |
| 1a = | PUa | · | ~Pda |
| Xa = | PUa | · | Pda |
| Zb = | ~Pub | · | ~PDb |
| 0b = | ~Pub | · | PDb |
| 1b = | Pub | · | ~PDb |
| Xb = | Pub | · | PDb |
| 1) $F \cdot X_A$ = false | AND | | $F \cdot X_B$ = false |
| 2) $F \cdot 0_A \cdot 1_B$ = false | AND | | $F \cdot 1_A \cdot 0_B$ = false |
| 3) $(F \cdot 1_B \neq F \cdot 1_A)$ | OR | | $(F \cdot 0_B \neq F \cdot 0_A)$ |
| 4) $F \cdot 0_B \rightarrow F \cdot 0_A$ | | | |
| 5) $F \cdot 1_B \rightarrow F \cdot 1_A$ | | | |

The following table shows how these five rules are applied to the circuit 1600.

| | |
|---|---|
| $F = i_0 i_1$ | |
| $PU_A$ = ~$i_0$~$i_1$ | $PD_A = i_0 + i_1$ |
| $PU_B$ = ~$i_0$ + ~$i_1$ | $PD_B$ = false |
| $Z_A$ = ~(~$i_0$~$i_1$) | ~($i_0 + i_1$) = false |

-continued

| | | | |
|---|---|---|---|
| $0_A =$ | $\sim(\sim i_0 \sim i_1)$ | $\cdot$ | $(i_0 + i_1) = i_0 + i_1$ |
| $1_A =$ | $(\sim i_0 \sim i_1)$ | $\cdot$ | $\sim(i_0 + i_1) = \sim i_0 \sim i_1$ |
| $X_A =$ | $(\sim i_0 \sim i_1)$ | $\cdot$ | $(i_0 + i_1) =$ false |
| $Z_B =$ | $\sim(\sim i_0 + \sim i_1)$ | $\cdot$ | $\sim(\text{false}) = i_0 i_1$ |
| $0_B =$ | $\sim(\sim i_0 + \sim i_1)$ | $\cdot$ | $(\text{false}) =$ false |
| $1_B =$ | $(\sim i_0 + \sim i_1)$ | $\cdot$ | $\sim(\text{false}) = \sim i_0 + \sim i_1$ |
| $X_B =$ | $(\sim i_0 + \sim i_1)$ | $\cdot$ | $(\text{false}) =$ false |

In this example, the direction of the MOS device T 900 can be set from A to B towards output $O_0$ 1600 rather than output $O_1$ 1611, as evaluation of the five rules shows that all five rules or conditions are satisfied:

1) $F \cdot X_A = (i_0\ i_1)(\text{false}) = \text{false}$, and $F \cdot X_B = (i_0\ i_1)(\text{false}) = \text{false}$ 2) $F \cdot 0_A \cdot 1_B = (i_0\ i_1) \cdot (i_0 + i_1) \cdot (\sim i_0 + \sim i_1) = \text{false}$
$F \cdot 1_A \cdot 0_B = (i_0\ i_1) \cdot (\sim i_0 \sim i_1) \cdot (\text{false}) = \text{false}$ 3) $F \cdot 0_B = (i_0 i_1) \cdot (\text{false}) = \text{false}$
$F \cdot 0_A = (i_0 i_1) \cdot (i_0 + i_1) = i_0 i_1$
$i_0 i_1 \ne \text{false}$, so this rule is satisfied 4) $F \cdot 0_B = (i_0 i_1) \cdot (\text{false}) = \text{false}$
$F \cdot 0_A = (i_0 i_1) \cdot (i_0 + i_1) = i_0 i_1$
$(\text{false}) \to (i_0 i_1)$ is true, so this rule is satisfied.

5) $F \cdot 1_B = (i_0 i_1) \cdot (\sim i_0 + \sim i_1) = \text{false}$
$F \cdot 1_A = (i_0 i_1) \cdot (\sim i_0 \sim i_1) = \text{false}$
$(\text{false}) \to (\text{false})$ is true, so this rule is satisfied An example of how the rules can fail (so that the MOS device 900 and 901 cannot be directed from A to B) is applying the rules to determine if direction can be set from B to A. To demonstrate this, "A" and "B" are swapped in each rule (for example, rule 4 becomes $F \cdot 0b \to F \cdot 0a$). In this case, rules 1-3 are satisfied, but rule 4 is not:

$F \cdot 0_B = (i_0 i_1) \cdot (i_0 + i_1) = i_0 i_1$
$F \cdot 0_A = (i_0 i_1) \cdot (\text{false}) = \text{false}$
$(i_0 i_1) \to (\text{false})$ is false, so this rule is not satisfied The input that makes the rule fail is $i_0 = 1$, $i_1 = 1$. In the circuit 1600 shown in FIG. 16, with this input, the MOS device T 900 conducts, A is pulled to 0, and B floats to Z. Thus, T 900 passes 0 from A to B and, as expected, there is a failure when the direction is assigned from B to A. Net B is observable (it is an output net of the circuit, because it drives an inverter), so observability does not change the result.

Static CMOS Double NAND Gate—Illustrating Application of Observability

FIG. 17 illustrates another example of a static circuit, in particular, a static CMOS double NAND circuit 1700, and how the observability test can be used to determine whether MOS device T (900) can be directed when there is a bi-directional signal through it.

The static functions and rules (rules 1-5) are applied to the circuit 1700 shown in FIG. 17 as follows:

| | | | |
|---|---|---|---|
| $F =$ | $i_2$ | | |
| $PU_A =$ | $(\sim i_0 + \sim i_1)\ i_0 = i_0 \sim i_1$ | | $PD_A = i_1$ |
| $PU_B =$ | $\sim i_1 + \sim i_2$ | | $PD_B =$ false |
| $Z_A =$ | $\sim(i_0 \sim i_1)$ | $\cdot$ | $\sim(i_1) = \sim i_0 \sim i_1$ |
| $0_A =$ | $\sim(i_0 \sim i_1)$ | $\cdot$ | $(i_1) = i_1$ |
| $1_A =$ | $(i_0 \sim i_1)$ | $\cdot$ | $\sim(i_1) = i_0 \sim i_1$ |
| $X_A =$ | $(i_0 \sim i_1)$ | $\cdot$ | $(i_1) =$ false |
| $Z_B =$ | $\sim(\sim i_1 + \sim i_2)$ | $\cdot$ | $\sim(\text{false}) = (i_1 i_2)$ |
| $0_B =$ | $\sim(\sim i_1 + \sim i_2)$ | $\cdot$ | $(\text{false}) =$ false |
| $1_B =$ | $(\sim i_1 + \sim i_2)$ | $\cdot$ | $\sim(\text{false}) = (\sim i_1 + \sim i_2)$ |
| $X_B =$ | $(\sim i_1 + \sim i_2)$ | $\cdot$ | $(\text{false}) =$ false |

The five static rules are evaluated as follows:

1) $F \cdot X_A = (i_2)\ (\text{false}) = \text{false}$
$F \cdot X_B = (i_2)\ (\text{false}) = \text{false}$ 2) $F \cdot 0_A \cdot 1_B = (i_2)\ (i_1)\ (\sim i_1 + \sim i_2) = \text{false}$
$F \cdot 1_A \cdot 0_B = (i_2)\ (i_0 \sim i_1)\ (\text{false}) = \text{false}$ 3) $F \cdot 1_B = (i_2)\ (\sim i_1 + \sim i_2) = \sim i_1$
$F \cdot 1_A = (i_2)\ (i_0 \sim i_1) = i_0 \sim i_1\ i_2$
$(\sim i_1) \ne (i_0 \sim i_1\ i_2)$, so rule 3 is satisfied 4) $F \cdot 0_B = (i_2)\ (\text{false}) = \text{false}$
$F \cdot 0_A = (i_2)\ (i_1) = i_2\ i_1$
$(\text{false}) \to (i_2\ i_1)$ is true, so rule 4 is satisfied.

5) $F \cdot 1_B = (i_2)\ (\sim i_1 + \sim i_2) = (\sim i_1 i_2)$
$F \cdot 1_A = (i_2)\ (i_0 \sim i_1) = (i_0 \sim i_1\ i_2)$
$(\sim i_1 i_2) \to (i_0 \sim i_1\ i_2)$ is false, so rule 5 is not satisfied Thus, in this example, rules 1-4 are satisfied, but rule 5 is not. This indicates that the signal flows through the device 900 from B to A. As a result, the observability test (FIG. 13) is performed to determine whether the bi-directional signals has uni-directional observability.

The input that causes the predicate of rule 5 to fail is $\sim i_0 \sim i_1 i_2$ (because when this predicate is true, $F \cdot 1_B$ is true and $F \cdot 1_A$ is false). When this predicate is true, the NMOS which connects net A to output net O2 does not conduct because $i_0 = 0$. There is no other output net reachable from net A. As a result, the input that causes rule 5 to fail can never be observed. Thus, the MOS device T 900 can be directed from A to B in applications which are only concerned with observable signal flow, e.g., for applications such as equivalence checking that are based on logical correctness at output nets.

Pre-Charged AND/OR Gate

FIG. 18 is a diagram of a dynamic AND/OR gate 1800 having nets A and B that are pre-charged with clocks CLK 1400. Since the circuit 1800 is a dynamic circuit, the functions and rules applicable to dynamic circuits are used to analyze the signal flow direction: (again, 'n' stands for A or B)

$Z_n = \text{false}$ $0_n = PD_n$ $1_n = \sim PD_n$ $X_n = \text{false}$

Rules when nets A and B are pre-charged to 1.
1) $(F \cdot 1_A \cdot 0_B) = \text{false}$
2) T strongly passes 0
3) $(F \cdot 0_B) \ne (F \cdot 0_A)$ The dynamic rules (1-3) are applied to the circuit shown in FIG. 18 as follows:

| | | |
|---|---|---|
| $F =$ | $i_0 i_1$ | |
| $PU_A =$ | $\sim(i_0 + i_1) = \sim i_0 \sim i_1$ | $PD_A = i_0 + i_1$ |
| $PU_B =$ | $\sim(\text{false}) = \text{true}$ | $PD_B =$ false |
| $0_A =$ | $i_0 + i_1$ | |
| $1_A =$ | $\sim i_0 \sim i_1$ | |
| $0_B =$ | false | |
| $1_B =$ | true | |

Determine if direction can be set from A to B:

1) $F \cdot 1_A \cdot 0_B = (\sim i_0 \sim i_1)(i_0\ i_1)(\text{false}) = (\text{false})$ 2) The MOS device that links A and B is an nMOS, which strongly passes 0.

3) $F \cdot 0_B = (i_0\ i_1)\ (\text{false}) = \text{false}$
$F \cdot 0_A = (i_0\ i_1)\ (i_0 + i_1) = (i_0\ i_1)$
$(\text{false}) \to (i_0\ i_1)$ is true, so rule 3 passes.

Thus, all of the rules 1-3 above are satisfied, and the direction can be set from A to B towards output $O_0$ 1810 rather than output $O_1$ 1811.

Determine if direction can be set from B to A:

1) $F \cdot 1_B \cdot O_4 = (i_0 i_1)(\text{true})(i_0 + i_1) = (i_0 i_1)$ $(i_0 i_1)$ is not equal to (false), so rule 1 is not satisfied, and the direction cannot be set from B to A. Referring to FIG. 18, the input $i_0 = 1$, $i_1 = 1$ causes a signal to flow from A to B, which is why the device direction cannot be set from B to A. Thus, the results of the rules are consistent with the circuit operation.

Thus, embodiments allow the direction of a MOS device to be set if examination of surrounding MOS devices shows that for all inputs, the signal through the MOS device can only flow in one direction. Further, when signal is bi-directional, the MOS device can be directed if all signals in one direction fail an observability test. Thus, embodiments direct more MOS devices by defining functions and analyzing rules, and also direct additional MOS devices that would otherwise remain undirected using known methods and systems. Thus, embodiments of the invention direct more MOS devices than known methods, thereby simplifying circuit analysis and making the analysis more accurate and time and cost efficient.

These benefits are achieved with both static and dynamic devices. In contrast, known global check methods of known tools ignore paths that do not end in an output, which may not be safe in dynamic circuits because a device may drive an internal net, and that net may store a charge that influences the output at a later time. If this path is not considered, the MOS device may be directed so that the precharged net can not acquire charge. Embodiments address shortcomings of know global check methods by identifying precharged nets and taking these cases into account.

Further advantages of embodiments include eliminating false positives in direction assignment since embodiments assign a direction that is safe under all input conditions. In contrast, various known methods rely on heuristics to set directions based on typical structures. Further, embodiments advantageously reduce false negatives by detecting false paths. Previous methods, such as logical topological checks, do not set direction if there are paths that drive a signal through a MOS device both directions. Often, all of the paths in one direction are false paths. Embodiments address these shortcomings by correctly setting the direction if all of the paths in one direction are false paths, because embodiments construct paths by building a function that tests that the paths considered can be sensitized, and ignores paths that can not be sensitized.

Additionally embodiments can be safely applied to a wide range of circuits without manual intervention by a user since they do not make assumptions about relative strength of inputs and internal nets. Thus, embodiments improve upon known assignment methods, which make such assumptions, and which can lead to false positives. Embodiments also advantageously involves relative device strength to pass different logical values, and pre-charged nets. This allows embodiments to be used to set the direction of MOS devices in dynamic gates that other known methods can not safely handle.

Further, although implementation of embodiments with regard to exemplary static and dynamic circuits are described above, embodiments can be applied to other situations, including cases in which dynamic circuits where a MOS circuit that is to be directed has a precharge on one net to which it is connected but not the other. Another example includes the case in which a dynamic circuits precharge internal nets to "0" rather than "1". Thus, a precharge and precharging nets is defined to include these alternatives.

In the foregoing specification, the embodiments have been described with reference to specific elements and steps thereof. It will, however, be evident that various modifications and changes may be made thereto without departing from the broader spirit and scope of the embodiments. For example, it is to be understood that the specific ordering and combination of process actions shown in the process flow diagrams described herein are merely illustrative, and that or additional process steps, or a different combinations and/or ordering thereof can be used. Further, embodiments can be applied to various static and dynamic MOS circuits and various sizes of circuits having different numbers of MOS devices. The specification and drawings are, accordingly, to be regarded in an illustrative rather than restrictive sense.

What is claimed is:

1. A method for implementing a physical MOS device in a circuit comprising analyzing the MOS device, the method comprising:

identifying an undirected MOS device in the circuit, the undirected MOS device linking a first net and a second net;

defining functions of the first and second nets that cause each net to be a set of logic values as a function of inputs to the circuit;

determining whether a signal flows through the undirected MOS device in one or two directions according to a set of rules that applies defined functions, wherein the set of rules for a static device having no pre-charged nets differs from the set of rules for a dynamic device having a pre-charged net;

directing the undirected MOS device in one direction if the signal flows through the undirected MOS device in one direction; and implementing the physical MOS device in the circuit based at least in part upon the identified MOS devices.

2. The method of claim 1, further comprising:

generating a representation of undirected MOS devices of the same type;

determining the direction of a signal through the representation; and directing individual undirected MOS devices that were used to generate the representation, wherein the individual undirected MOS devices is directed according to the direction of the signal through the representation.

3. The method of claim 2, identifying undirected MOS devices being performed after the act of generating the representation, determining the direction and directing the individual undirected MOS devices.

4. The method of claim 1, wherein the act of defining functions is being performed without a path through the undirected MOS device.

5. The method of claim 1, wherein the act of defining functions comprising defining functions of the first and second nets to have any of 1, 0, X, and Z logic values, wherein the functions have logic values depending on the inputs to the circuit.

6. The method of claim 1, wherein the circuit is a static circuit having no pre-charged nets.

7. The method of claim 6, the set of rules having five rules.

8. The method of claim 1, wherein the circuit is a dynamic circuit having at least one pre-charged net.

9. The method of claim 8, wherein the dynamic circuit has two pre-charged nets.

10. The method of claim 8, the set of rules having three rules.

11. The method of claim 1, wherein the set of rules applies a subset of the defined functions.

12. The method of claim 1, defining functions comprising the steps of:
defining a pullup function (Pu) of each net; and
defining a pulldown function (Pd) of each net.

13. The method of claim 12, defining functions further comprising defining the functions:

$Zn = \sim PUn \cdot \sim PDn$, $0n = \sim PUn \cdot PDn$, $1n = PUn \cdot \sim PDn$, $Xn = PUn \cdot PDn$, wherein ~represents Boolean negation,
Zn represents high impedance
0n represents zero,
1n represents one,
Xn represents an error at a net,
PUn represents a pullup function,
PDn represents a pulldown function,
the operator "·" is logical AND, and
"n" represents the first or second net.

14. The method of claim 13, further comprising the step of defining a function (F) that is true if a signal flows through the undirected MOS device, wherein the following rules indicate a signal that flows in one direction through the undirected MOS device:

$F \cdot X_A$=false AND $F \cdot X_B$=false,
$F \cdot 0_A \cdot 1B$=false AND $F \cdot 1_A \cdot 0_B$=false,
$(F \cdot 1_B \neq F \cdot 1_A)$ OR $(F \cdot 0_B \neq F \cdot 0_A)$,
$F \cdot 0_B \rightarrow F \cdot 0_A$, and
$F \cdot 1_B \rightarrow F \cdot 1_A$,
wherein,
$0_A$ represents zero at a first net,
$0_B$ represents zero at a second net,
$1_A$ represents one at a first net,
$1_B$ represents one at a first net,
$X_A$ represents an error at a first net,
$X_B$ represents an error at a second net,
F represents the function that is true if the MOS device conducts,
"AND" is a logical AND
"OR" is a logical OR,
the operator "·" is logical AND,
the operator "→" is the implication operator, and
the operator "=" tests that two functions are identical, and
the operator "≠" tests that two functions are not identical.

15. The method of claim 13, wherein the set of rules applies only the functions 0n, 1n and Xn.

16. The method of claim 1, defining functions comprising the step of defining a pulldown function (Pd) of each net, wherein Pd maps all possible inputs to a circuit to true if the input causes a conducting path to ground.

17. The method of claim 16, defining functions further comprising defining the following functions:

$Zn$=false, $0n = PDn$, $1n = \sim PDn$, and $Xn$=false, wherein

~represents Boolean negation,
Zn represents hight impedance at a net,
0n represents zero at a net,
1n represents one at a net,
Xn represents an errors at a net,
PDn represents a pulldown function for a net, and
and "n" represents either the first or second net.

18. The method of claim 17, further comprising the step of defining a function (F) that is true if a signal flows through the undirected MOS device, wherein the following set of rules indicates a signal flows in one direction through the undirected MOS device:

$F \cdot 1_A \cdot 0_B$=false,
T strongly passes 0, and
$(F \cdot 0_B) \neq (F \cdot 0_A)$, wherein,
$0_A$ represents zero at a first net,
$0_B$ represents zero at a second net,
$1_A$ represents one at a first net,
T represents the MOS device,
F represents the function that is true if the MOS device conducts,
the operator "·" is logical AND,
the operator "=" tests that two functions are identical, and
the operator "≠" tests that two functions are not identical.

19. The method of claim 17, wherein the set of rules applies only the functions 0n and 1n.

20. The method of claim 1, wherein the signal flows through the undirected MOS device in two directions, further comprising the step of determining whether the two direction signal is observable in only one direction.

21. The method of claim 20, wherein the two direction signal is observable in one direction, further comprising the step of directing the undirected MOS device in one direction.

22. The method of claim 20, wherein the two direction signal is observable in two directions, and the undirected MOS device remains undirected.

23. A method for implementing a physical MOS device in a circuit comprising analyzing the MOS device, the method comprising:
identifying an undirected MOS device in the circuit, the undirected MOS device linking a first net and a second net;
defining functions of the first and second nets that cause each net to be a set of logic values as a function of inputs to the circuit;
determining whether a signal flows through the undirected MOS device in one or two directions according to a set of rules that applies defined functions, wherein the set of rules for a static device having no pre-charged nets differs from the set of rules for a dynamic device having a pre-charged net;
directing the undirected MOS device if one of two conditions (a) and (b) is satisfied:
(a) the signal flows through the undirected MOS device in one direction,
(b) the signal flows through the undirected MOS device in two directions and is observable in one direction; and
implementing the physical MOS device in the circuit based at least in part upon the identified MOS devices.

24. The method of claim 23, wherein the act of defining functions comprising defining functions of the first and second nets to have any of 1, 0, X, and Z logic values, wherein the functions have logic values depending on the inputs to the circuit.

25. The method of claim 23, wherein the circuit is a static circuit having no pre-charged nets.

26. The method of claim 25, the set of rules having five rules.

27. The method of claim 23, wherein the circuit is a dynamic circuit having at least one pre-charged net.

28. The method of claim 27, wherein the dynamic circuit has two pre-charged nets.

29. The method of claim 27, the set of rules having three rules.

30. The method of claim 23, wherein the set of rules applies a subset of the defined functions.

31. The method of claim 23, defining functions comprising the steps of:
  defining a pullup function (Pu) of each net, wherein Pu maps all possible inputs to a circuit to true; and
  defining a pulldown function (Pd) of each net, wherein Pd maps all possible inputs to a circuit to false.

32. The method of claim 31, defining functions further comprising defining the functions:

$Zn = \sim PUn \cdot \sim PDn$, $0n = \sim PUn \cdot PDn$, $1n = PUn \cdot \sim PDn$, and $Xn = PUn \cdot PDn$, wherein ~represents Boolean negation,
Zn represents high impedance at a net,
0n represents zero at a net,
1n represents one at a net,
Xn represents an error at a net,
PUn represents a pullup function for a net,
PDn represents a pulldown function for a net,
the operator "·" is a logical AND, and
"n" represents either the first or second net.

33. The method of claim 32, further comprising defining a function (F) that is true if a signal flows through the undirected MOS device, wherein the following set of rules indicates a signal that flows in one direction through the undirected MOS device:
$F \cdot X_A$=false AND $F \cdot X_B$=false,
$F \cdot 0_A \cdot 1_B$=false AND $F \cdot 1_A \cdot 0_B$=false,
$(F \cdot 1_B \neq F \cdot 1_A)$ OR $(F \cdot 0_B \neq F \cdot 0_A)$,
$F \cdot 0_B \rightarrow F \cdot 0_A$, and
$F \cdot 1_B \rightarrow F \cdot 1_A$ wherein,
$0_A$ represents zero at a first net,
$0_B$ represents zero at a second net,
$1_A$ represents one at a first net,
$1B$ represents one at a second net,
$X_A$ represents an error at a first net,
$X_B$ represents an error at a second net,
F represents the function that is true if the MOS device conducts,
"AND" is a logical AND,
"OR" is a logical OR,
the operator "·" is logical AND,
the operator "→" is the implication operator,
the operator "=" tests that two functions are identical, and
the operator "≠" tests that two functions are not identical.

34. The method of claim 23, defining functions comprising the step of defining a pulldown function (Pd) of each net, wherein Pd maps all possible inputs to a circuit to false.

35. The method of claim 34, defining functions further comprising defining the following functions:

$Zn$=false, $0n = PDn$, $1n = \sim PDn$, and $Xn$=false, wherein

~represents boolean negation
Zn represents high impedance,
0n represents zero,
1n represents one,
Xn represents an error at a net,
PDn represents a pulldown function, and
"n" represents either the first of second net.

36. The method of claim 35, further comprising defining a function (F) that is true if a signal flows through the undirected MOS device, wherein the following set of rules indicates a signal flows in one direction through the undirected MOS device:
$F \cdot 1_A \cdot 0_B$=false,
T strongly passes 0, and
$(F \cdot 0_B) \neq (F \cdot 0_A)$, wherein
$0_A$ represents zero at a first net,
$0_B$ represents zero at a second net,
$1_A$ represents one at a first net,
T represents the MOS device,
F represents the function that is true if the MOS device conducts,
the operator "·" is logical AND,
the operator "=" tests that two functions are identical, and
the operator "≠" tests that two functions are not identical.

37. A method for implementing a physical MOS device in a circuit comprising analyzing the MOS device, comprising:
  identifying an undirected MOS device in the static circuit, the undirected MOS device linking a first net and a second net;
  defining functions of the first and second nets that cause each net to be a set of {1, 0, X, Z} logic values as a function of inputs to the circuit, the step of defining functions including the steps of:
    defining a pullup function (Pu) of each net, wherein Pu maps all possible inputs to a circuit to true,
    defining a pulldown function (Pd) of each net, wherein Pd maps all possible inputs to a circuit to false, and
    defining the following functions based on Pu and Pd:

$Zn = \sim PUn \cdot \sim PDn$, $0n = \sim PUn \cdot PDn$, $1n = PUn \cdot \sim PDn$, and $Xn = PUn \cdot PDn$, wherein defining a function (F) that is true if a signal flows through the MOS device;
  determining whether a signal flows through the undirected MOS device in one or two directions according to a set of rules that applies defined functions, wherein the following set of rules indicates that a signal flows through the MOS device in one direction:
  $F \cdot X_A$=false AND $F \cdot X_B$=false,
  $F \cdot 0_A \cdot 1_B$=false AND $F \cdot 1_A \cdot 0_B$=false,
  $(F \cdot 1_B \neq F \cdot 1_A)$ OR $(F \cdot 0_B \neq F \cdot 0_A)$,
  $F \cdot 0_B \rightarrow F \cdot 0_A$, and
  $F \cdot 1_B \rightarrow F \cdot 1_A$ wherein,
  $0_A$ represents zero at a first net,
  $0_B$ represents zero at a second net,
  $1_A$ represents one at a first net,
  $1B$ represents one at a second net,
  $X_A$ represents an error at a first net,
  $X_B$ represents an error at a second net,
  F represents the function that is true if the MOS device conducts,
  "AND" is a logical AND,
  "OR" is a logical OR,
  the operator "·" is logical AND,
  the operator "→" is the implication operator, the operator "=" tests that two functions are identical, and the operator "≠" tests that two functions are not identical;

directing the undirected MOS device in one direction if one of two conditions (a) and (b) is satisfied: (a) the set rules is satisfied so that the signal flows through the undirected MOS device in one direction, (b) the signal flows through the undirected MOS device in two directions and is observable in one direction; and implementing the physical MOS device in the static circuit based at least in part upon the identified MOS devices.

38. A method for implementing a physical MOS device in a circuit implementing a MOS device in a dynamic comprising analyzing the MOS device, the method comprising:

identifying an undirected MOS device in the dynamic circuit, the undirected MOS device linking a first net and a second net, wherein at least one net is pre-charged with a clock;

defining functions of the first and second nets that cause each net to be a set of {1, 0, X, Z} logic values as a function of the inputs to the circuit, the step of defining functions including the steps of defining a pulldown function Pd of each net, wherein Pd maps all possible inputs to a circuit to false, and defining the following functions based on Pd:

Zn=false,

0n=PDn,

1n=~PDn, and

Xn=false, wherein defining a function (F) that is true if a signal flows through the undirected MOS device in the dynamic circuit;

determining whether a signal flows through the undirected MOS device in one or two directions according to a set of rules that applies defined functions, wherein the following set of rules indicates that a signal flows through the MOS device in one direction:

$F \cdot 1_A \cdot 0_B$=false,

T strongly passes 0, and $(F \cdot 0_B) \neq (F \cdot 0_A)$, wherein $0_A$ represents zero at a first net, $0_B$ represents zero at a second net, $1_A$ represents one at a first net, T represent the MOS device, F represents the function that is true if the MOS device conducts, the operator "·" is logical AND, the operator "=" tests that two functions are identical, and the operator "≠" tests that two functions are not identical;

directing the undirected MOS device in one direction if one of two conditions (a) and (b) is satisfied:

(a) the set of rules is satisfied so that the signal flows through the undirected MOS device in one direction, (b) the signal flows through the undirected MOS device in two direction and is observable in one direction; and implementing the physical MOS device in the circuit based at least in part upon the identified MOS devices.

* * * * *

UNITED STATES PATENT AND TRADEMARK OFFICE
CERTIFICATE OF CORRECTION

| | | |
|---|---|---|
| PATENT NO. | : 7,644,380 B1 | |
| APPLICATION NO. | : 11/433960 | |
| DATED | : January 5, 2010 | |
| INVENTOR(S) | : Pandey et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 461 days.

Signed and Sealed this

Sixteenth Day of November, 2010

David J. Kappos
*Director of the United States Patent and Trademark Office*